United States Patent
Matsue et al.

(10) Patent No.: US 9,599,642 B2
(45) Date of Patent: Mar. 21, 2017

(54) CURRENT SENSOR

(71) Applicant: ALPS ELECTRIC CO., LTD.

(72) Inventors: Ken Matsue, Miyagi-ken (JP);
Manabu Tamura, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 157 days.

(21) Appl. No.: 14/594,996

(22) Filed: Jan. 12, 2015

(65) Prior Publication Data
US 2015/0123650 A1 May 7, 2015

Related U.S. Application Data

(63) Continuation of application No. PCT/JP2013/005612, filed on Sep. 24, 2013.

(30) Foreign Application Priority Data

Sep. 28, 2012 (JP) ................................ 2012-217519

(51) Int. Cl.
*G01R 7/06* (2006.01)
*G01R 19/00* (2006.01)
*G01R 15/20* (2006.01)

(52) U.S. Cl.
CPC ....... *G01R 19/0092* (2013.01); *G01R 15/207* (2013.01)

(58) Field of Classification Search
CPC ...................... G01R 19/0092; G01R 15/207
See application file for complete search history.

(56) References Cited

FOREIGN PATENT DOCUMENTS

| JP | 2005-70037 | 3/2005 |
|----|-----------|--------|
| JP | 2011-13200 | 1/2011 |
| JP | 2012-78232 | 4/2012 |

OTHER PUBLICATIONS

Search Report dated Dec. 17, 2013 from International Application No. PCT/JP2013/005612.

*Primary Examiner* — Melissa Koval
*Assistant Examiner* — Courtney McDonnough
(74) *Attorney, Agent, or Firm* — Beyer Law Group LLP

(57) ABSTRACT

A current sensor includes a first current path including a first flat-shaped portion, and a first magnetoelectric conversion element arranged on the first current path and configured to detect magnetism generated when a current to be measured flows through the first current path, wherein the current sensor measures the current to be measured of a device to which the first current path is connected, a first conductive convex portion is provided, in the first current path, in a direction in which the current to be measured flows, and the first magnetoelectric conversion element is arranged at a position on the first current path, at which a magnetic flux density due to the current to be measured of a minimum frequency used in the device and a magnetic flux density due to the current to be measured of a maximum frequency used in the device substantially coincide with each other.

5 Claims, 27 Drawing Sheets

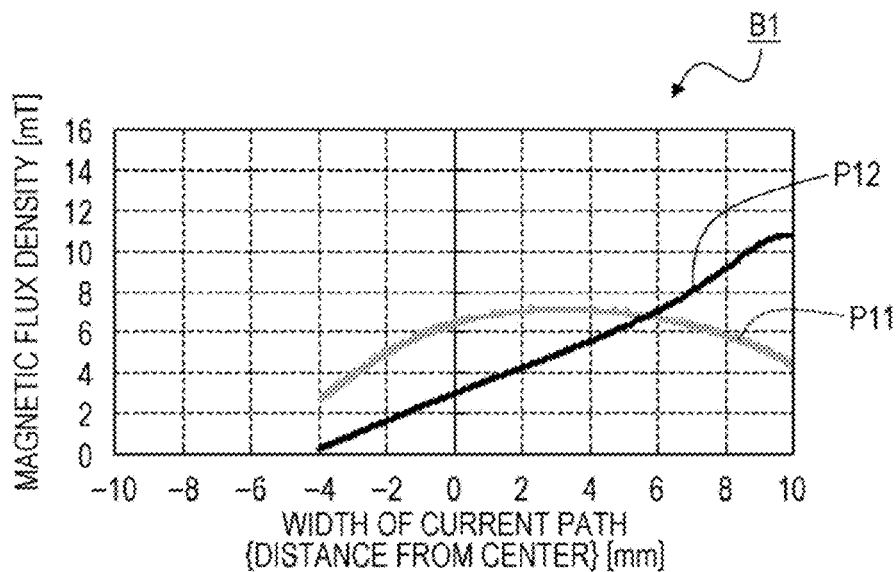
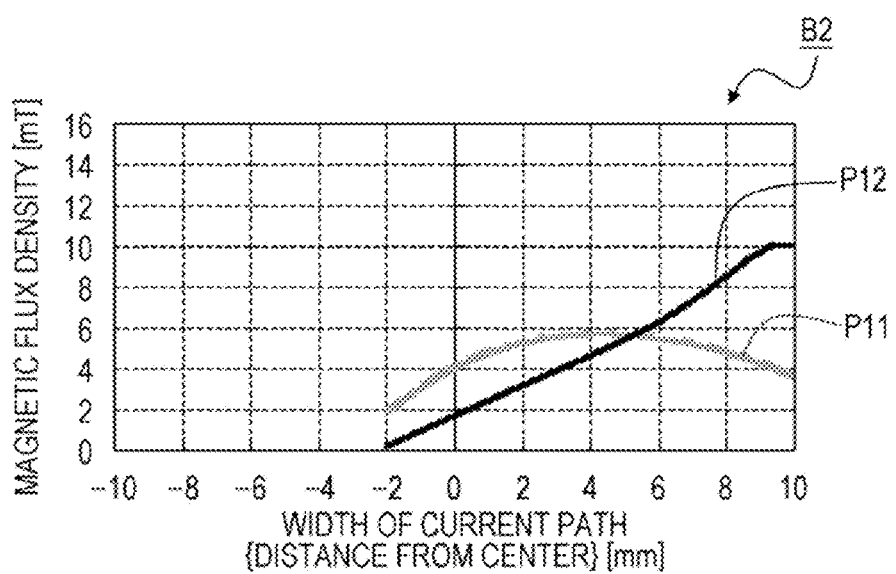

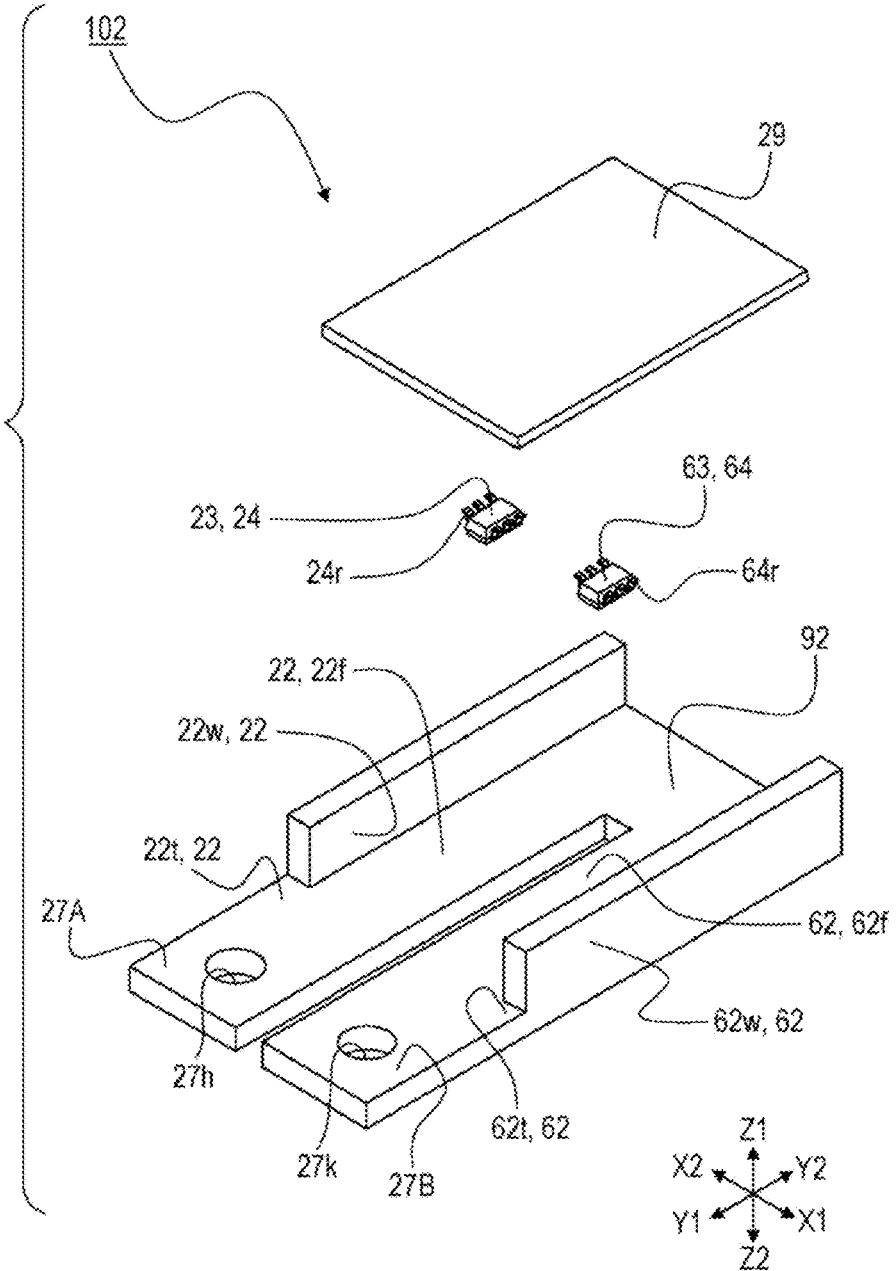

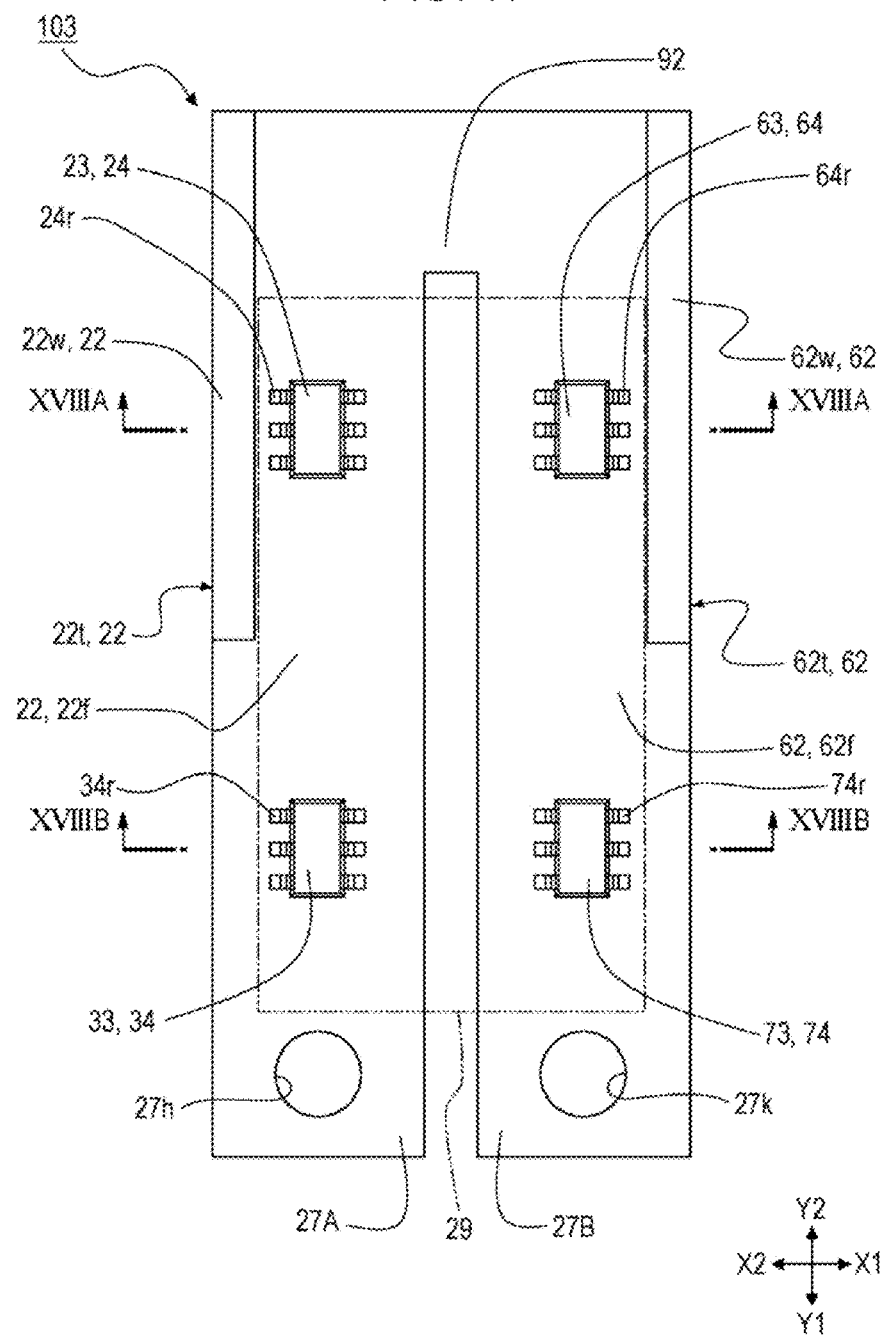

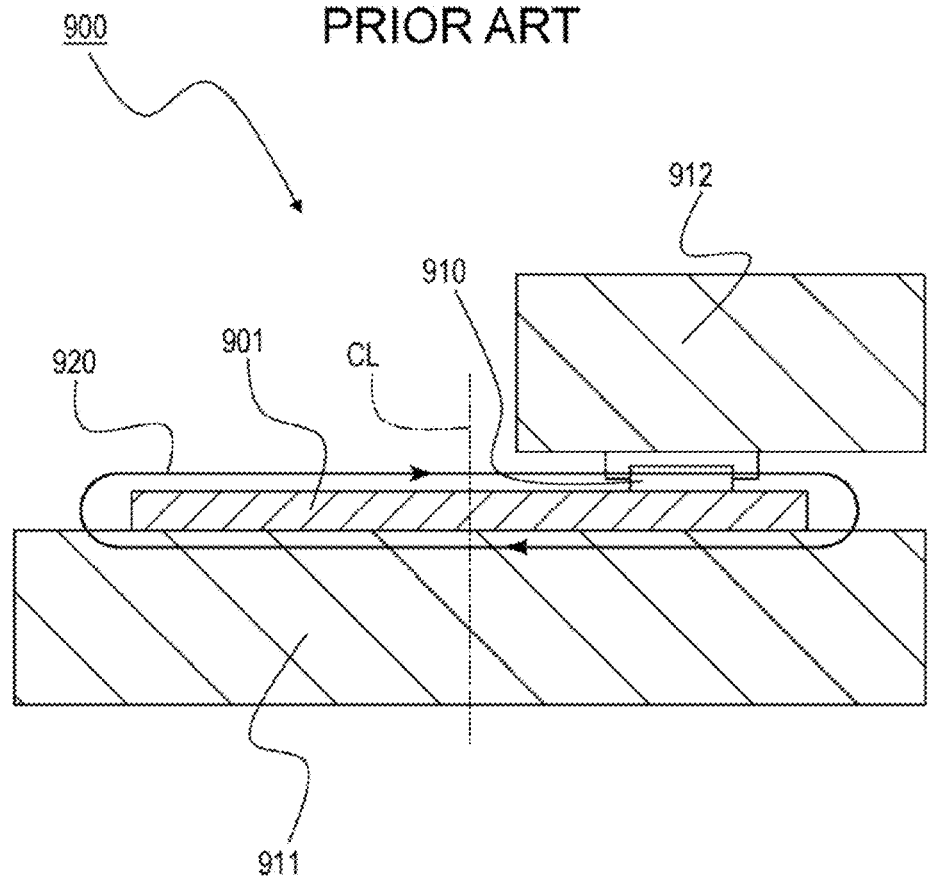

CURRENT SENSOR

CLAIM OF PRIORITY

This application is a Continuation of International Application No. PCT/JP2013/005612 filed on Sep. 24, 2013, which claims benefit of Japanese Patent Application No. 2012-217519 filed on Sep. 28, 2012. The entire contents of each application noted above are hereby incorporated by reference.

BACKGROUND OF THE INVENTION

1. Field of the Invention

The present invention relates to a current sensor for measuring currents to be measured flowing through various kinds of devices, using a magnetoelectric conversion element, and in particular, relates to a current sensor suitable for a case where the frequencies of currents to be measured flowing through various kinds of devices each of which is equipped with an inverter or the like vary.

2. Description of the Related Art

In recent years, in order to control or monitor various kinds of devices, usually current sensors attached to the various kinds of devices and configured to measure currents to be measured flowing through the various kinds of devices have been used. As a current sensor of this kind, a method has been well known that utilizes a magnetoelectric conversion element (magnetic detecting element) such as a magnetoresistance effect element or a Hall element, used for sensing a magnetic field generated from a current to be measured flowing through a current path.

Among the above-mentioned current sensors, such a current measurement apparatus (current sensor) 900 as proposed in Japanese Unexamined Patent Application Publication No. 2005-70037 has been generally known that utilizes a flat-shaped conductor to be measured (current path) and a magnetic sensor arranged on an insulating substrate. FIG. 27 is a diagram explaining the current measurement apparatus 900 disclosed in Japanese Unexamined Patent Application Publication No. 2005-70037 and is a cross-sectional view illustrating a positional relationship between a magnetic sensor 910 and a conductor to be measured 901. As illustrated in FIG. 27, the current measurement apparatus 900 includes the conductor to be measured 901 formed in a printed substrate 911 and the magnetic sensor 910 (equipped with a magnetic detecting element) mounted in a printed substrate 912 and detects, using the magnetic sensor 910, a magnetic field 920 generated in the width direction of the conductor to be measured 901 when a current to be measured flows through the conductor to be measured 901.

By the way, if the frequency of the current to be measured flowing through such a flat-shaped conductor to be measured 901 increases, the current to be measured is concentrated into end portions of the conductor to be measured 901 by a skin effect, a current density becomes small in the middle of the conductor to be measured 901, and the current density becomes large in the vicinities of ends of the conductor to be measured 901. Therefore, in a case where the magnetic sensor 910 is disposed in the middle of the conductor to be measured 901 (disposed in an end portion, in FIG. 27), there has been a problem that the magnetic field 920 in the vicinity of the middle, sensed by the magnetic sensor 910, is reduced and the current sensitivity of the current measurement apparatus 900 is reduced.

Therefore, in the current measurement apparatus 900 of the related art, as illustrated in FIG. 27, the magnetic sensor 910 is provided at a position located a predetermined distance away from the central position CL of the conductor to be measured 901 in the width direction thereof. From this, it is assumed that it is possible to provide the current measurement apparatus 900 in which the reduction of the measurement sensitivity is suppressed even in a case of a current to be measured whose frequency is high.

However, in the related art, the magnetic sensor 910 is disposed in the vicinity of an end of the conductor to be measured 901 in accordance with the frequency of the current to be measured, scheduled to be measured. Therefore, there has been a problem that, in a case of being applied to another device utilizing a current to be measured whose frequency is different or in a case where a frequency changes based on a state even in a case of the same device, the sensitivity of a current measured in the current measurement apparatus 900 widely varies and it is difficult to obtain correct measurement accuracy. In addition, as the case where the frequency of the current to be measured changes based on a state, a case may be cited in which, in, for example, an electric vehicle or a hybrid vehicle, the frequency of the current to be measured changes based on states such as at the time of idling, at the time of acceleration, and at the time of regenerative brake.

The present invention solves the above-mentioned problem and provides a current sensor capable of accurately measuring a current to be measured even if the frequency of the current to be measured changes.

SUMMARY OF THE INVENTION

The present invention provides a current sensor of the present invention that includes a first current path including a first flat-shaped portion, and a first magnetoelectric conversion element arranged on the first current path and configured to detect magnetism generated when a current to be measured flows through the first current path, wherein the current sensor measures the current to be measured of a device to which the first current path is connected, a first conductive convex portion is provided, in the first current path, in a direction in which the current to be measured flows, and the first magnetoelectric conversion element is arranged at a position on the first current path, at which a minimum frequency magnetic flux density serving as a magnetic flux density in a case of passing the current to be measured of a minimum frequency used in the device and a maximum frequency magnetic flux density serving as a magnetic flux density in a case of passing the current to be measured of a maximum frequency used in the device substantially coincide with each other.

According to this, in the current sensor of the present invention, the first conductive convex portion is provided, in the first current path, in a direction in which the current to be measured flows. Therefore, the minimum frequency magnetic flux density serving as a magnetic flux density in a case of passing the current to be measured of the minimum frequency used in the device (device to be measured) and the maximum frequency magnetic flux density serving as a magnetic flux density in a case of passing the current to be measured of the maximum frequency may be brought close to each other and caused to line up more with each other. Therefore, it is possible to arrange the first magnetoelectric conversion element at a position at which a change in the magnetic flux density associated with a change in the frequency is small. From this, the minimum frequency magnetic flux density and the maximum frequency magnetic flux density are not widely different from each other even if the frequency of the current to be measured changes. Therefore, it is possible to accurately measure a current value.

In addition, in the current sensor of the present invention, it is preferable that the first convex portion is provided to stand from one of end portions of the first flat-shaped portion.

According to this, it is possible to move, to the central side of the first current path, a position at which the minimum frequency magnetic flux density and the maximum frequency magnetic flux density substantially coincide with each other. From this, it is possible for the first magnetoelectric conversion element to be arranged so as to be brought closer to the vicinity of the middle of the first current path 12, and compared with a case where the magnetic sensor (magnetoelectric conversion element) 910 is disposed in an outer side portion of the conductor to be measured (current path) 901 in such a manner as the related art, it is possible to reduce the influence of an external magnetizing field from a neighboring current path or the like.

In addition, in the current sensor of the present invention, it is preferable that the first flat-shaped portion and the first convex portion are integrally formed by bending a metal plate.

According to this, at the time of manufacturing, it is possible to easily manufacture the first flat-shaped portion and the first convex portion from one metal plate. From this, it is possible to reduce the cost of the current sensor.

In addition, it is preferable that the current sensor of the present invention further includes a second current path including a second flat-shaped portion, and a second magnetoelectric conversion element arranged on the second current path and configured to detect magnetism generated when the current to be measured flows through the second current path, wherein a connection portion connecting one of ends of the first current path and one of ends of the second current path is provided, the first current path and the second current path are disposed in parallel, the other end of the second current path is connected to the device, a second conductive convex portion is provided, in the second current path, in a direction in which the current to be measured flows, the second magnetoelectric conversion element is arranged at a position on the second current path, at which a minimum frequency magnetic flux density serving as a magnetic flux density in a case of passing the current to be measured of a minimum frequency used in the device and a maximum frequency magnetic flux density serving as a magnetic flux density in a case of passing the current to be measured of a maximum frequency used in the device substantially coincide with each other, the first convex portion is provided to stand from one of the end portions, located on a side farther away from the second current path, the second convex portion is provided to stand from an end portion located on a side farther away from the first current path, and the first magnetoelectric conversion element and the second magnetoelectric conversion element are provided on a same substrate.

According to this, the second conductive convex portion is provided, in the second current path, in a direction in which the current to be measured flows. Therefore, the minimum frequency magnetic flux density serving as a magnetic flux density in a case of passing the current to be measured of the minimum frequency used in the device and the maximum frequency magnetic flux density serving as a magnetic flux density in a case of passing the current to be measured of the maximum frequency may be brought close to each other and caused to line up more with each other. Therefore, it is possible to arrange the second magnetoelectric conversion element at a position at which a change in the magnetic flux density associated with a change in the frequency is small. From this, the minimum frequency magnetic flux density and the maximum frequency magnetic flux density are not widely different from each other even if the frequency of the current to be measured changes. Therefore, it is possible to accurately measure a current value in the second current path. Furthermore, since the first magnetoelectric conversion element and the second magnetoelectric conversion element are used and individually provided on the same substrate, influences due to an external magnetic field or an internal magnetic field generated when a current flows through a current path (the first current path and the second current path) appear, with equal strength, in the two magnetoelectric conversion elements (the first magnetoelectric conversion element and the second magnetoelectric conversion element). Therefore, by subjecting outputs from the two magnetoelectric conversion elements (the first magnetoelectric conversion element and the second magnetoelectric conversion element) to differential processing, it is possible to more correctly cancel out the influences of the magnetic field. From this, it is possible to reduce the deterioration of the measurement accuracy of the current sensor.

In addition, in the current sensor of the present invention, it is preferable that at least the two or more first magnetoelectric conversion elements are included and at least the two or more second magnetoelectric conversion elements are included, at least one of the first magnetoelectric conversion elements is arranged at a first position of the first flat-shaped portion, from which the first convex portion is provided to stand, at least one of the first magnetoelectric conversion elements is arranged at a third position of the first flat-shaped portion, from which the first convex portion is not provided to stand, at least one of the second magnetoelectric conversion elements is arranged at a second position of the second flat-shaped portion, from which the second convex portion is provided to stand, and at least one of the second magnetoelectric conversion elements is arranged at a fourth position of the second flat-shaped portion, from which the second convex portion is not provided to stand.

According to this, the first magnetoelectric conversion element and the second magnetoelectric conversion element, arranged at the first position of the first current path, from which the first convex portion is provided to stand, and the second position of the second current path, from which the second convex portion is provided to stand, respectively, and the first magnetoelectric conversion element and the second magnetoelectric conversion element, arranged at the third position of the first current path, from which the first convex portion is not provided to stand, and the fourth position of the second current path, from which the second convex portion is not provided to stand, respectively, are each separately arranged. From this, differences in absolute quantity between respective magnetic quantities detected by the first magnetoelectric conversion element and the second magnetoelectric conversion element, arranged at the first position and the second position, respectively, and respective magnetic quantities detected by the first magnetoelectric conversion element and the second magnetoelectric conversion element, arranged at the third position and the fourth position, respectively, are caused. Therefore, it is possible to properly use, for measuring a high current, the first magnetoelectric conversion element and the second magnetoelectric conversion element, arranged at the first position and the second position, respectively, and it is possible to properly use, for measuring a low current, the first magnetoelectric conversion element and the second magnetoelectric conversion element, arranged at the third position and the fourth position, respectively. From this, it is possible to perform wide-range measurement for high current measurement, and it is possible to perform highly accurate measurement for low current measurement.

In addition, in the current sensor of the present invention, it is preferable that the first flat-shaped portion, the first convex portion, the connection portion, the second flat-shaped portion, and the second convex portion may be integrally formed by bending a metal plate.

According to this, at the time of manufacturing, it is possible to easily manufacture the first flat-shaped portion, the first convex portion, the connection portion, the second flat-shaped portion, and the second convex portion from one metal plate. From this, it is possible to reduce the cost of the current sensor.

BRIEF DESCRIPTION OF THE DRAWINGS

FIGS. 8A and 8B are simulation results of the current sensor of the first embodiment of the present invention and include graphs corresponding to the models illustrated in FIGS. 6A and 6B;

FIG. 9 is an exploded perspective view explaining a current sensor of a second embodiment of the present invention;

FIG. 17 is a configuration diagram explaining the current sensor of the third embodiment of the present invention and is a top view viewed from a Z1 side illustrated in FIG. 16;

FIG. 18A is a cross-sectional view taken along a line XVIIIA-XVIIIA illustrated in FIG. 17, and FIG. 18B is a cross-sectional view taken along a line XVIIIB-XVIIIB illustrated in FIG. 17;

FIG. 22A is a simulation result in a direction of a line B illustrated in FIG. 19 in the current sensor of the third embodiment of the present invention, and FIG. 22B is a simulation result of a comparative example compared with FIG. 22A;

FIG. 23A is a model diagram of a first example of a modification, FIG. 23B is a model diagram of a second example of a modification, FIG. 23C is a model diagram of a third example of a modification, and FIG. 23D is a model diagram of a fourth example of a modification;

FIG. 24A is a plan view of a fifth example of a modification, and FIG. 24B is a plan view of a sixth example of a modification;

FIG. 25A is a perspective view of a seventh example of a modification, FIG. 25B is a perspective view of an eighth example of a modification, and FIG. 25C is a perspective view of a ninth example of a modification;

FIG. 26A is a diagram of a model of a comparative example used in a simulation, and FIG. 26B is a graph of a simulation result of the model; and FIG. 27 is a diagram explaining a current measurement apparatus of the related art and is a cross-sectional view illustrating a positional relationship between a magnetic sensor and a conductor to be measured.

DESCRIPTION OF THE PREFERRED EMBODIMENTS

Hereinafter, embodiments of the present invention will be described with reference to the drawings.

[First Embodiment]

Figure 1:
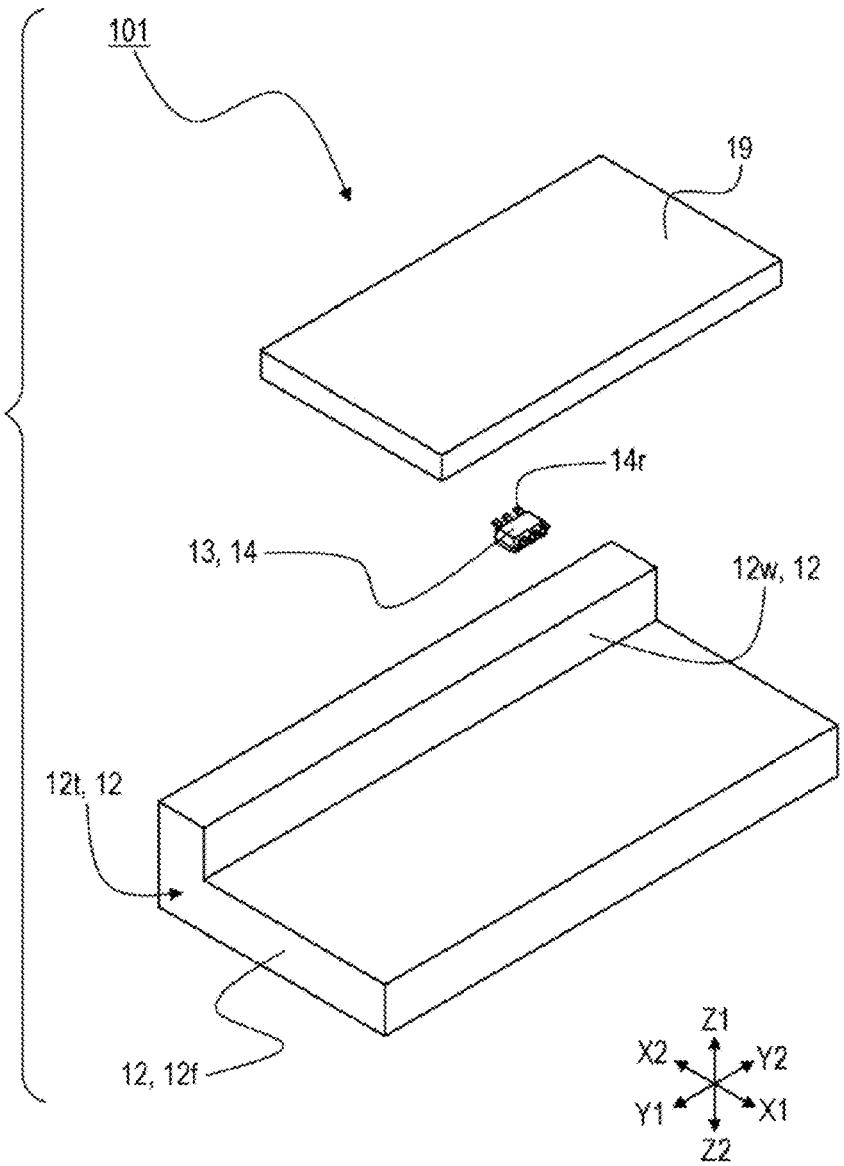
FIG. 1 is an exploded perspective view explaining a current sensor of a first embodiment of the present invention.
Figure 2:
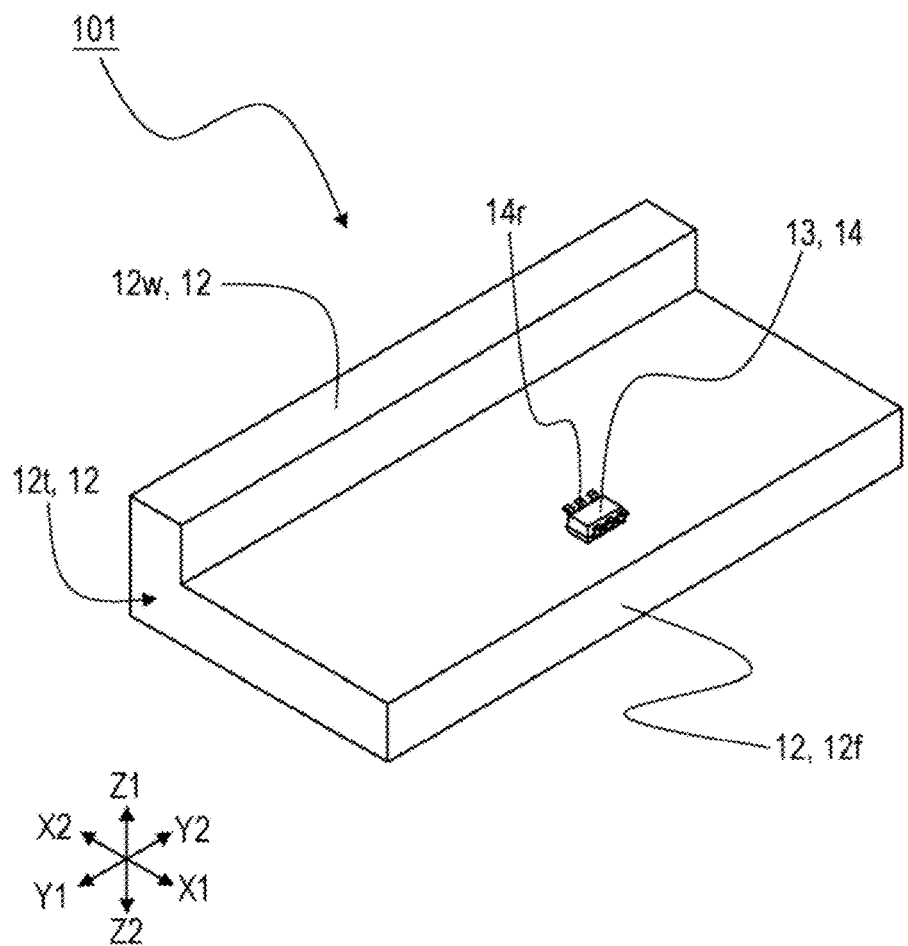
FIG. 2 is a perspective view explaining the current sensor of the first embodiment of the present invention.
Figure 3:
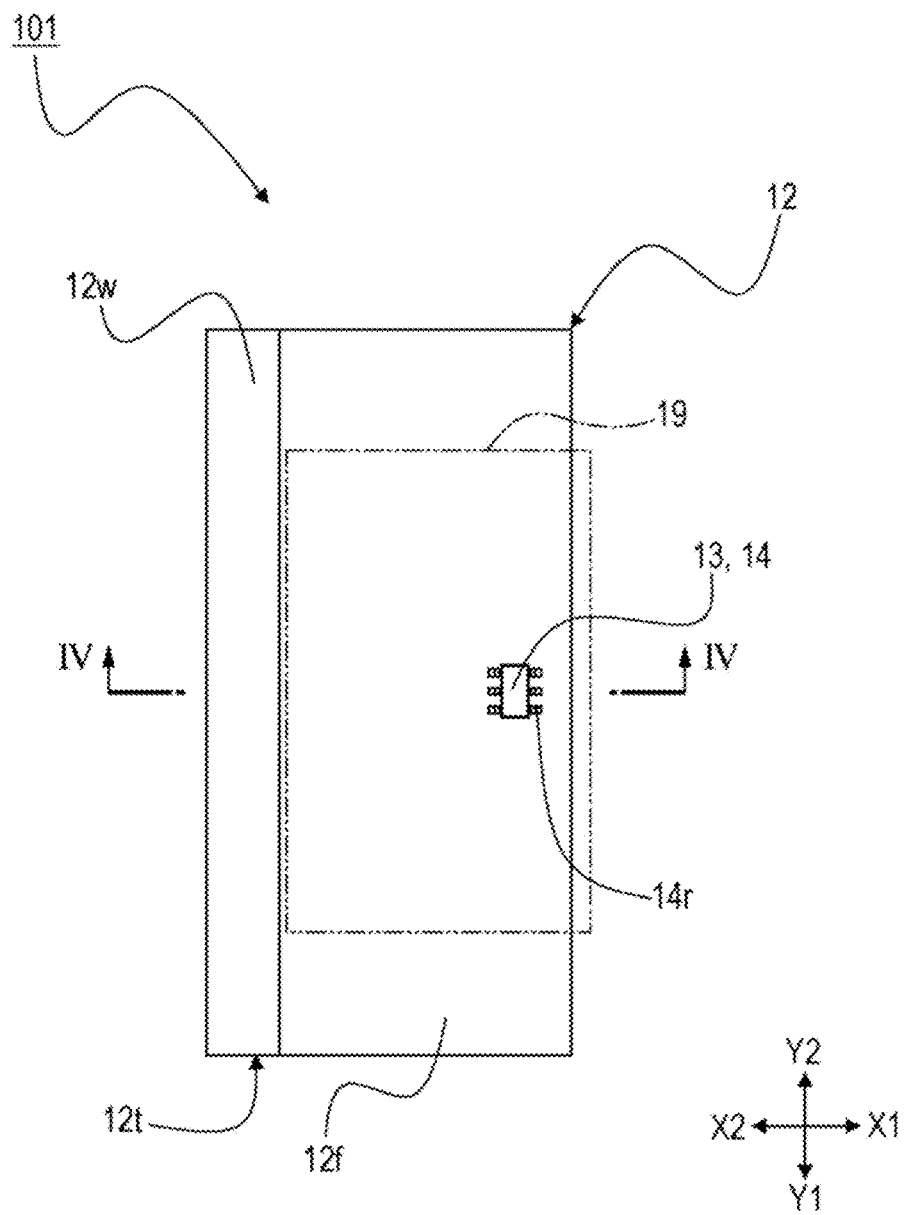
FIG. 3 is a configuration diagram explaining the current sensor of the first embodiment of the present invention and is a top view viewed from a Z1 side illustrated in FIG. 2.
Figure 4:
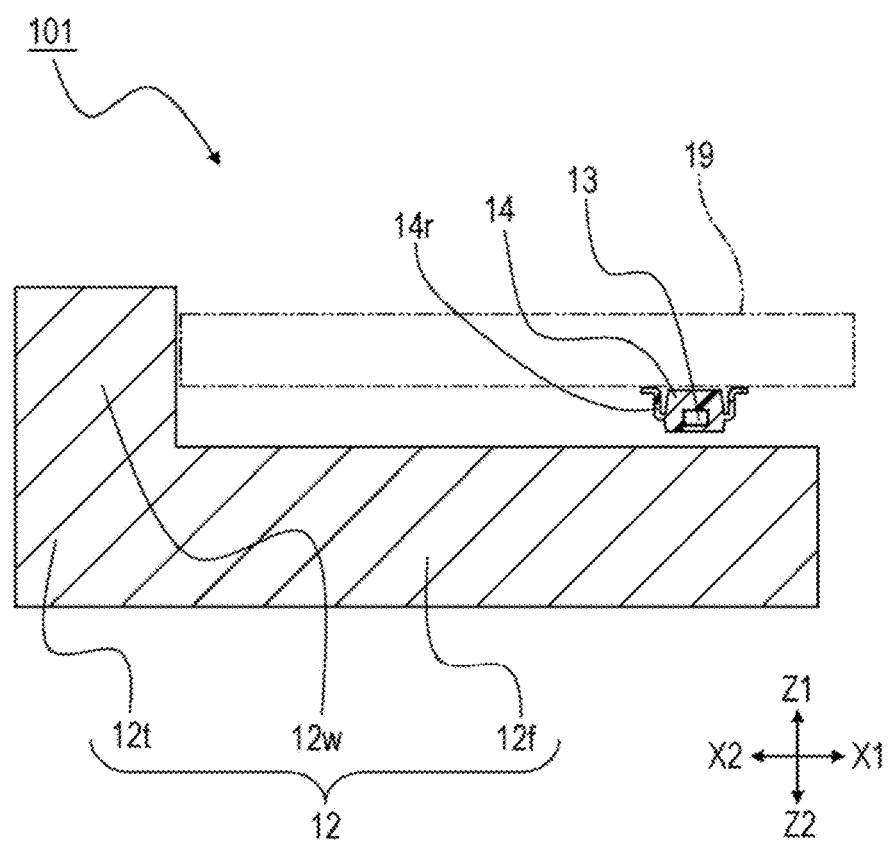
FIG. 4 is a configuration diagram explaining the current sensor of the first embodiment of the present invention and is a cross-sectional view taken along a line IV-IV illustrated in FIG. 3.

FIG. 1 is an exploded perspective view explaining a current sensor 101 of a first embodiment of the present invention. FIG. 2 is a perspective view explaining the current sensor 101 of the first embodiment of the present invention. In addition, for ease of explanation, an insulating substrate 19 is omitted. FIG. 3 is a configuration diagram explaining the current sensor 101 of the first embodiment of the present invention and is a top view viewed from a Z1 side illustrated in FIG. 2. FIG. 4 is a configuration diagram explaining the current sensor 101 of the first embodiment of the present invention and is a cross-sectional view taken along a line IV-IV illustrated in FIG. 3.

As illustrated in FIG. 1 to FIG. 4, the current sensor 101 of the first embodiment of the present invention may be configured to include a first current path 12 including a first flat-shaped portion 12f, and a first magnetoelectric conversion element 13 arranged on the first current path 12. In addition to this, the insulating substrate 19 arranged so as to face the first current path 12, and a connector, connected to an external control device so as to supply electric power to the current sensor 101 and extract a signal from the current sensor 101 while not illustrated, are provided.

Using a metallic material with a good conductive property such as copper (Cu), the first current path 12 may be configured to include the first flat-shaped portion 12f and a first convex portion 12w provided to stand from one of end portions 12t of the first current path 12, as illustrated in FIG. 1 to FIG. 4. In addition, this first convex portion 12w may be formed in a direction in which a current to be measured flows (a Y direction illustrated in FIG. 2). In addition, while not illustrated, holding portions used for connecting to and fixing a current path to be measured (a current path intended to be measured) of a device (device to be measured) not illustrated are provided on both the end portion sides of the first current path 12.

In addition, a metal plate such as a copper (Cu) may be bent, thereby integrally forming the first flat-shaped portion 12f and the first convex portion 12w. From this, at the time of manufacturing, it is possible to easily manufacture the first flat-shaped portion 12f and the first convex portion 12w from one metal plate. From this, it is possible to reduce the cost of the current sensor 101.

The first magnetoelectric conversion element 13 may be an element for detecting magnetism generated when the current to be measured flows through the first current path 12, and the first magnetoelectric conversion element 13 is packaged into a magnetic sensor package 14 using, for example, a magnetoresistance effect element (called a giant magneto resistive (GMR) element) utilizing a giant magnetoresistance effect, as illustrated in FIG. 4. In addition, as illustrated in FIG. 2 and FIG. 3, the first magnetoelectric conversion element 13 is arranged on the first flat-shaped portion 12f, is arranged in the vicinity of the middle of the first flat-shaped portion 12f in the longitudinal direction thereof, and is arranged on the other end portion side of the first current path 12. In addition, the sensitivity direction of the first magnetoelectric conversion element 13 is arranged so as to face in an X direction illustrated in FIG. 3.

After the GMR element is manufactured on a silicon substrate, a cut-out chip of the GMR element and lead terminals 14r for extracting a signal are electrically connected and subjected to packaging using a thermosetting synthetic resin, thereby manufacturing this magnetic sensor package 14. In addition, the magnetic sensor package 14 is soldered to the insulating substrate 19 serving as a circuit substrate by the lead terminals 14r, and is connected to the external control device through a wiring pattern and the connector, not illustrated. In addition, while the first magnetoelectric conversion element 13 is subjected to packaging and arranged, as the magnetic sensor package 14, in the insulating substrate 19, the first magnetoelectric conversion element 13 may be arranged, for example, without change, in other words, may be subjected to so-called bare chip mounting and arranged.

In the insulating substrate 19, a widely-known general single-sided printed wiring board is used, and a wiring pattern is formed in a base substrate made of a glass-added epoxy resin by subjecting a metal foil such as copper (Cu), provided on the base substrate, to patterning. As illustrated in FIG. 3 and FIG. 4, in the insulating substrate 19, one magnetic sensor package 14 into which the first magnetoelectric conversion element 13 is packaged is mounted. Note that while the printed wiring board made of a glass-added epoxy resin is used for the insulating substrate 19, not only this but also, for example, a ceramic wiring board or a flexible wiring board may be used. In addition, while, in the first embodiment of the present invention, the circuit substrate is suitably used as the insulating substrate 19, not only the circuit substrate but also a structure may be adopted in which a circuit substrate is stacked on the insulating substrate 19 and the magnetic sensor package 14 is mounted thereon.

Figure 5A:
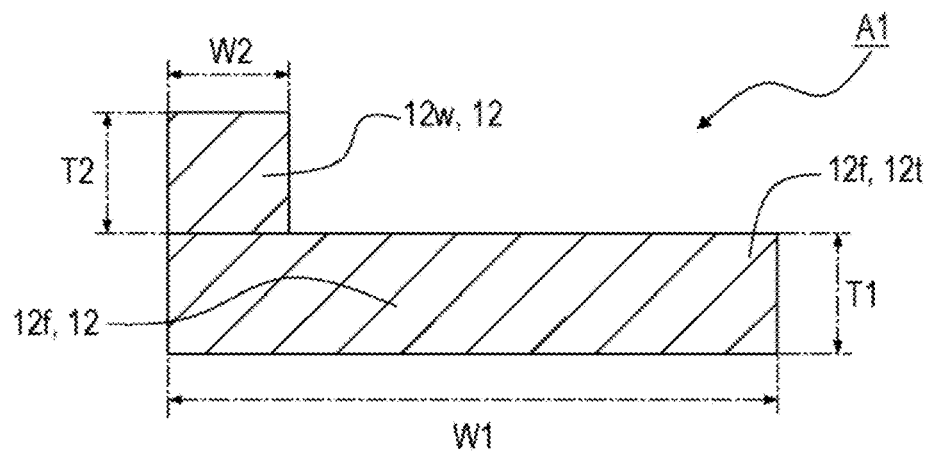
FIGS. 5A and 5B are cross-sectional views of first current paths of two models used in a simulation of the current sensor of the first embodiment of the present invention, which are individually illustrated in FIGS. 5A and 5B.
Figure 5B:
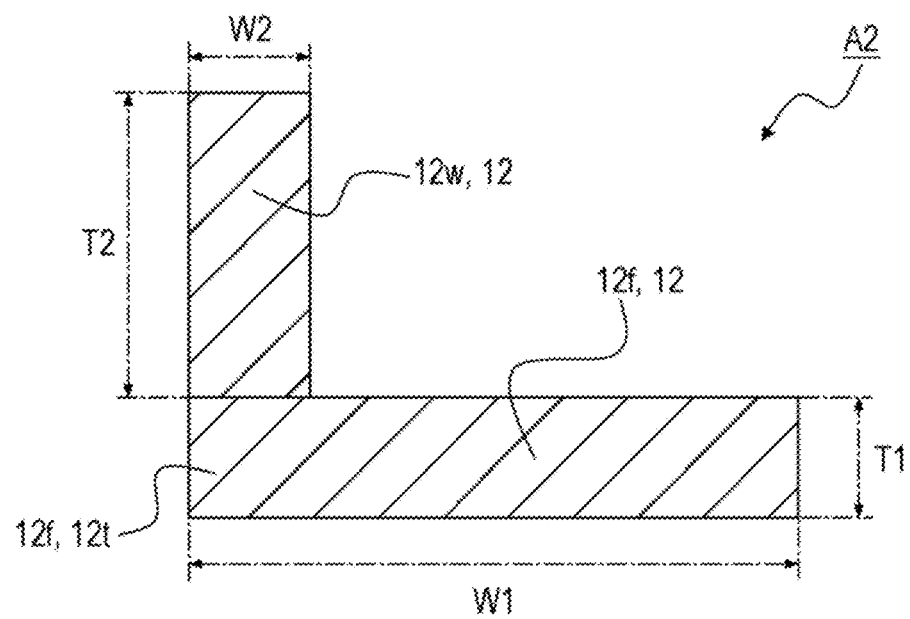
Figure 6A:
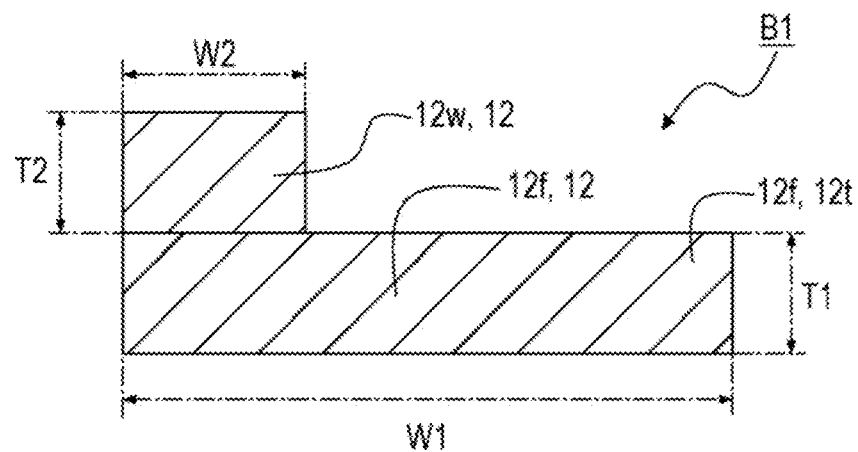
FIGS. 6A and 6B are cross-sectional views of first current paths of two models used in a simulation of the current sensor of the first embodiment of the present invention, which are individually illustrated in FIGS. 6A and 6B.
Figure 6B:
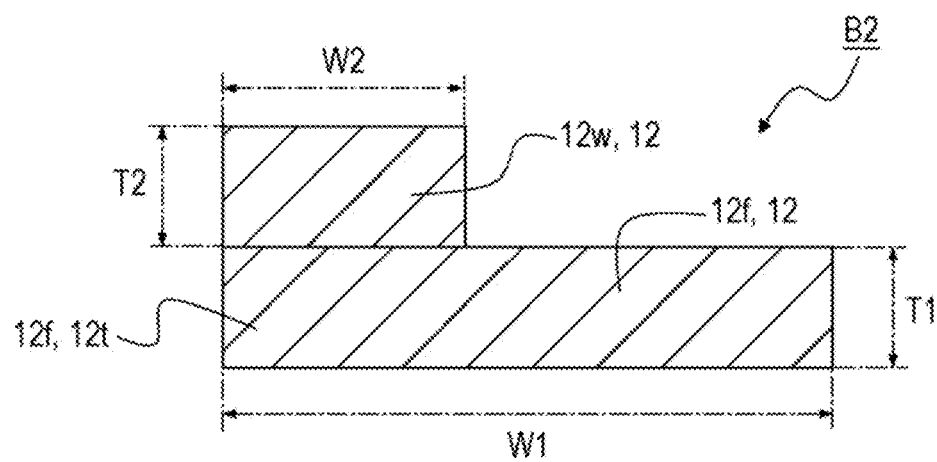

Regarding the current sensor 101 configured as above, magnetizing field analysis utilizing a finite element analysis system was performed with respect to a change in a magnetizing field in a case where a current to be measured whose frequency was different flowed. FIGS. 5A and 5B are cross-sectional views of first current paths 12 of models used in a simulation of the current sensor of the first embodiment of the present invention, FIG. 5A is a model A1, and FIG. 5B is a model A2. In addition, FIGS. 6A and 6B are cross-sectional views of first current paths 12 of models used in a simulation of the current sensor of the first embodiment of the present invention, FIG. 6A is a model B1, and FIG. 6B is a model B2.

As for numerical values used in the simulation (see FIGS. 5A and 5B and FIGS. 6A and 6B), the entire length of the first current path 12 was set to 100 (mm), the entire width W1 thereof was set to 20 (mm), the thickness T1 of the first flat-shaped portion 12f was set to 4 (mm), the length of the first convex portion 12w was set to 100 (mm), and the same applied to all the models. On the other hand, as for the model A1, the width W2 of the first convex portion 12w was set to 4 (mm) and the thickness T2 thereof was set to 4 (mm). As for the model A2, the width W2 of the first convex portion 12w was set to 4 (mm) and the thickness T2 thereof was set to 10 (mm). As for the model B1, the width W2 of the first convex portion 12w was set to 6 (mm) and the thickness T2 thereof was set to 4 (mm). As for the model B2, the width W2 of the first convex portion 12w was set to 8 (mm) and the thickness T2 thereof was set to 4 (mm). And thus, these were caused to vary. In addition, the current sensor 101 illustrated in FIG. 1 to FIG. 4 embodies this model A1.

Figure 7A:
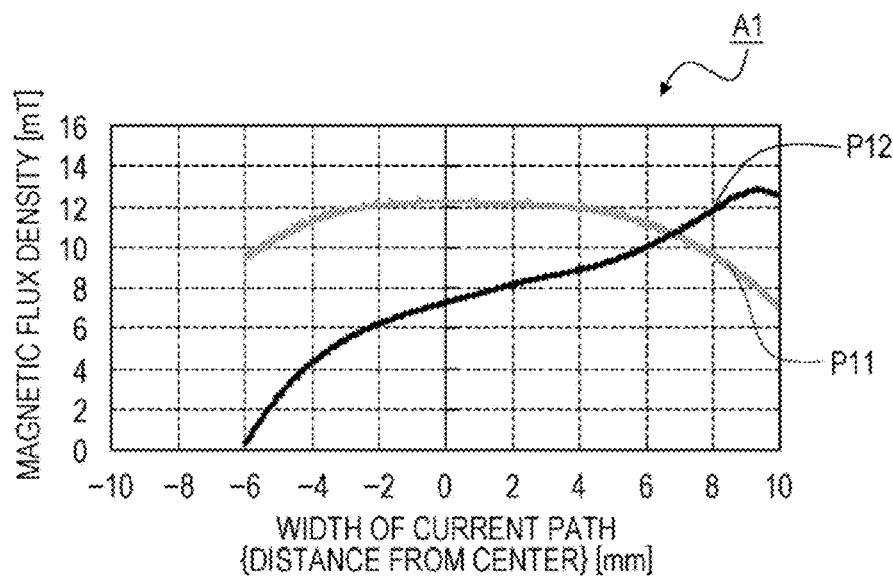
FIGS. 7A and 7B are simulation results of the current sensor of the first embodiment of the present invention and include graphs corresponding to the models illustrated in FIGS. 5A and 5B.
Figure 7B:
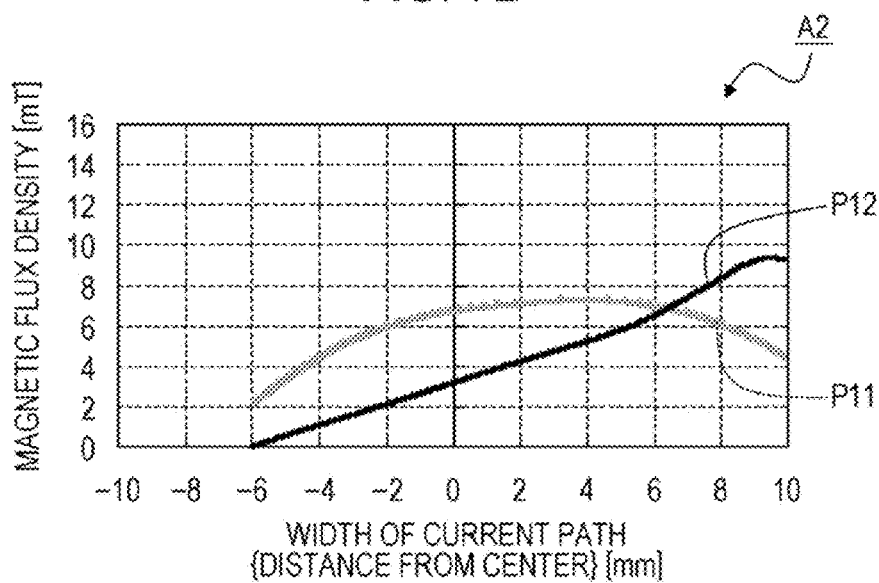

In addition, FIGS. 7A and 7B are simulation results of the current sensor of the first embodiment of the present invention and include graphs corresponding to the model A1 in FIG. 5A and the model A2 in FIG. 5B. FIGS. 8A and 8B are simulation results of the current sensor of the first embodiment of the present invention and include graphs corresponding to the model B1 in FIG. 6A and the model B2 in FIG. 6B. A horizontal axis in each of the graphs in FIGS. 7A and 7B and FIGS. 8A and 8B is the width W1 of the first current path 12 and indicates a distance from a center (10

(mm) on each of the right and left side). In addition, a vertical axis in each of the graphs in FIGS. 7A and 7B and FIGS. 8A and 8B indicates a magnetic flux density in a portion in which the first convex portion 12w is not provided in the first flat-shaped portion 12f. In addition, P11 in each of the drawings indicates a minimum frequency magnetic flux density in a case of a minimum frequency where the frequency of a current to be measured used in a device (device to be measured) is assumed to be 10 (Hz), and P12 in each of the drawings indicates a maximum frequency magnetic flux density in a case of a maximum frequency where the frequency of the current to be measured used in the device (device to be measured) is assumed to be 10 (kHz).

Figure 26A:
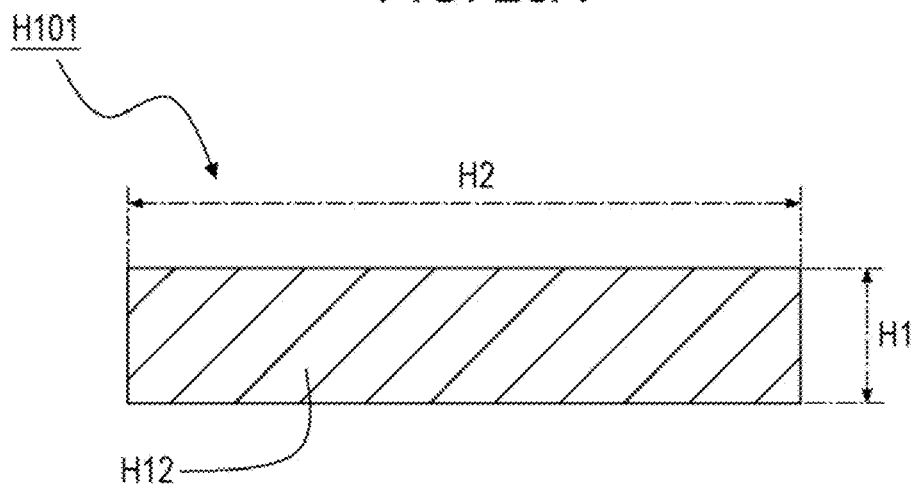
FIGS. 26A and 26B are diagrams compared with a current sensor of an embodiment of the present invention.
Figure 26B:
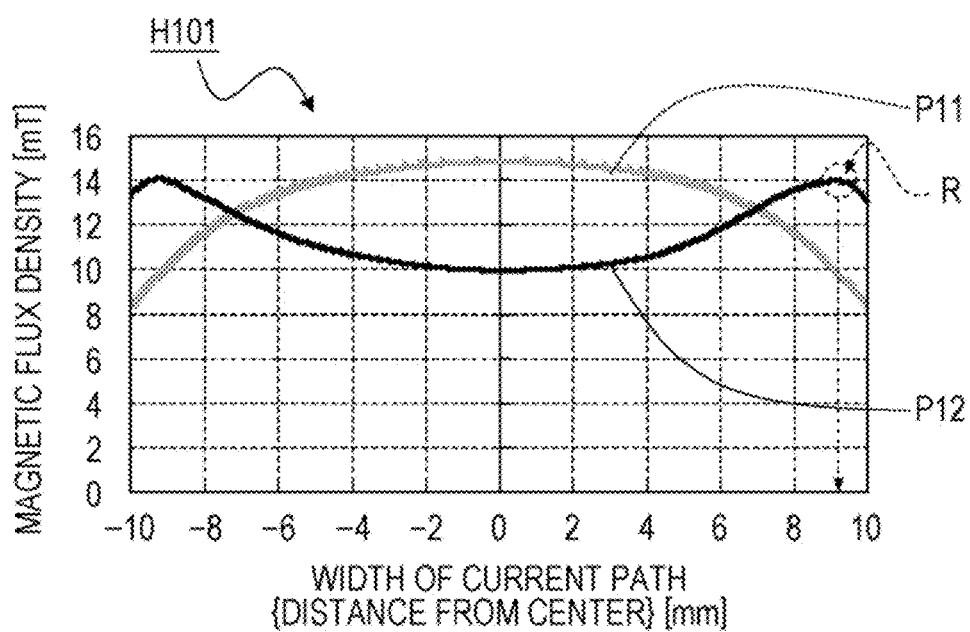

In addition, for the sake of comparison, a simulation was performed with respect to the configuration of the related art in which the first convex portion 12w does not exist in the first current path 12. FIGS. 26A and 26B are diagrams compared with the current sensor 101 of the first embodiment of the present invention, FIG. 26A is the diagram of a model H101 of a comparative example used in a simulation, and FIG. 26B is the graph of a simulation result of the model H101. In addition, regarding the model H101 of a comparative example, the length of a current path H12 was set to 100 (mm), the thickness H1 thereof was set to 4 (mm), and the width H2 thereof was set to 20 (mm), thereby applying same sizes.

As a result, compared with a case where a large difference in the magnetic flux density is generated by a difference between the low frequency and the high frequency of the current to be measured in such a manner as in FIG. 26B, a difference in the magnetic flux density, due to a difference between the low frequency and the high frequency of the current to be measured, in other words, a difference between the minimum frequency magnetic flux density P11 and the maximum frequency magnetic flux density P12, became small above the first flat-shaped portion 12f in which the first convex portion 12w is not provided, as illustrated in FIGS. 7A and 7B and FIGS. 8A and 8B. It is conceivable that the reason is that a magnetizing field around the first current path 12 was changed by providing the first convex portion 12w. Accordingly, by providing the first conductive convex portion 12w in a direction in which the current to be measured flows, it is possible for the minimum frequency magnetic flux density P11 and the maximum frequency magnetic flux density P12 to be brought close to each other and caused to line up more with each other.

From this, it is preferred that the first magnetoelectric conversion element 13 is arranged at a position on the first current path 12, at which the minimum frequency magnetic flux density P11 and the maximum frequency magnetic flux density P12 substantially coincide with each other. As illustrated in, for example, FIGS. 7A and 7B, in a case of the model A1, it is preferable that, on the first flat-shaped portion 12f in which the first convex portion 12w of the first current path 12 is not provided, the first magnetoelectric conversion element 13 is arranged at a position whose distance from the center is about 7 (mm). In addition, in a case of the model A2, it is preferable that, on the first flat-shaped portion 12f in which the first convex portion 12w of the first current path 12 is not provided, the first magnetoelectric conversion element 13 is arranged at a position whose distance from the center is about 6.5 (mm). In addition, as illustrated in FIGS. 8A and 8B, in a case of the model B1, it is preferable that, on the first flat-shaped portion 12f in which the first convex portion 12w of the first current path 12 is not provided, the first magnetoelectric conversion element 13 is arranged at a position whose distance from the center is about 5.5 (mm). In addition, in a case of the model B2, it is preferable that, on the first flat-shaped portion 12f in which the first convex portion 12w of the first current path 12 is not provided, the first magnetoelectric conversion element 13 is arranged at a position whose distance from the center is about 5 (mm). Since, in the current sensor 101 of the present invention, in this way, it is possible to arrange the first magnetoelectric conversion element 13 at a position at which a change in the magnetic flux density associated with a change in the frequency is small, the minimum frequency magnetic flux density P11 and the maximum frequency magnetic flux density P12 are not widely different from each other even if the frequency of the current to be measured changes. Therefore, it is possible to accurately measure a current value.

On the other hand, since, in the current measurement apparatus 900 of the related art, in order to suppress the reduction of the current sensitivity, the magnetic sensor 910 is provided at the position of the peak (an R portion in FIG. 26B) of the maximum frequency magnetic flux density P12 (a position whose distance from the center is about 9 (mm)), illustrated in FIG. 26B, a difference between the minimum frequency magnetic flux density P11 and the maximum frequency magnetic flux density P12 becomes large. Therefore, in a case of being applied to another device utilizing a current to be measured whose frequency is different or in a case where a frequency changes based on a state even in a case of the same device, the sensitivity of a current measured in the current measurement apparatus 900 widely varies and it is difficult to obtain correct measurement accuracy.

In addition, from results illustrated in FIGS. 7A and 7B and FIGS. 8A and 8B, the first convex portion 12w may be provided to stand from one of the end portions 12t of the first flat-shaped portion 12f, and the height T2 and the width W2 of the first convex portion 12w are changed, thereby enabling a position, at which a change in the magnetic flux density associated with a change in the frequency is small, to be arbitrarily changed. From this, it is possible to arbitrarily set the arrangement position of the first magnetoelectric conversion element 13. In addition, while not illustrated, by changing the shape of the first convex portion 12w, for example, a length, the surface shape of a corner, or the like, it is possible to change a position at which a change in the magnetic flux density associated with a change in the frequency is small, and it is possible to arbitrarily set the arrangement position of the first magnetoelectric conversion element 13.

In addition, from results illustrated in FIGS. 7A and 7B and FIGS. 8A and 8B, since the first convex portion 12w may be provided to stand from one of the end portions 12t of the first flat-shaped portion 12f, it is possible to move, to the central side of the first current path 12, a position at which the minimum frequency magnetic flux density P11 and the maximum frequency magnetic flux density P12 substantially coincide with each other. From this, it is possible for the first magnetoelectric conversion element 13 to be arranged so as to be brought closer to the vicinity of the middle of the first current path 12, and compared with a case where the magnetic sensor (magnetoelectric conversion element) 910 is disposed in an outer side portion of the conductor to be measured (current path) 901 in such a manner as the related art, it is possible to reduce the influence of an external magnetizing field from a neighboring current path or the like.

In addition, the existence of this advantageous effect enables the following problem to be solved. By changing the height H2 or the width W2 of the first convex portion 12w, it is possible to arbitrarily change a position at which the minimum frequency magnetic flux density P11 and the maximum frequency magnetic flux density P12 substantially coincide with each other. Therefore, it is possible to solve a problem that, in, for example, use for vehicle installation, a position at which a current sensor may be disposed is restricted and in such a current measurement apparatus 900 as the related art, it is difficult to arrange the magnetic sensor (magnetoelectric conversion element) 910 at the best possible position.

In addition, while it is preferred that the first magnetoelectric conversion element 13 is arranged at a position on the first current path 12, at which the minimum frequency magnetic flux density P11 and the maximum frequency magnetic flux density P12 substantially coincide with each other, the first magnetoelectric conversion element 13 may be arranged at a position on the first current path 12, which corresponds to a region in which the minimum frequency magnetic flux density P11 and the maximum frequency magnetic flux density P12 become comparable to each other. As illustrated in, for example, FIG. 7B, in a case of the model A2, the first magnetoelectric conversion element 13 may be arranged in a region in which the minimum frequency magnetic flux density P11 and the maximum frequency magnetic flux density P12 become comparable to each other, in other words, at a distance of 4.5 (mm) to 7.5 (mm) from the center or preferably a distance of 5.5 (mm) to 7 (mm) therefrom. As illustrated in, for example, FIG. 8B, in a case of the model B2, the first magnetoelectric conversion element 13 may be arranged at a distance of 2.5 (mm) to 7 (mm) from the center or preferably a distance of 4.5 (mm) to 6 (mm) therefrom. In this way, it is possible to provide the first convex portion 12w so as to widen a region in which the minimum frequency magnetic flux density P11 and the maximum frequency magnetic flux density P12 become comparable to each other. From this, it is possible to arbitrarily arrange the first magnetoelectric conversion element 13 within the range of this region. Therefore, even in a case where a position at which the current sensor 101 may be disposed is restricted in, for example, use for vehicle installation, it is possible to arrange the first magnetoelectric conversion element 13 at the best possible position.

Advantageous effects in the current sensor 101 of the first embodiment configured as above will be described below.

In the current sensor 101 of the first embodiment of the present invention, the first conductive convex portion 12w long in a direction in which the current to be measured flows may be provided in the first current path 12. Therefore, the minimum frequency magnetic flux density P11 serving as a magnetic flux density in a case of passing the current to be measured of the minimum frequency used in a device (device to be measured) and the maximum frequency magnetic flux density P12 serving as a magnetic flux density in a case of passing the current to be measured of the maximum frequency may be brought close to each other and caused to line up more with each other. Therefore, it is possible to arrange the first magnetoelectric conversion element 13 at a position at which a change in the magnetic flux density associated with a change in the frequency is small. From this, the minimum frequency magnetic flux density P11 and the maximum frequency magnetic flux density P12 are not widely different from each other even if the frequency of the current to be measured changes. Therefore, it is possible to accurately measure a current value.

In addition, since the first convex portion 12w may be provided to stand from one of the end portions 12t of the first flat-shaped portion 12f, it is possible to move, to the central side of the first current path 12, a position at which the minimum frequency magnetic flux density P11 and the maximum frequency magnetic flux density P12 substantially coincide with each other. From this, it is possible for the first magnetoelectric conversion element 13 to be arranged so as to be brought closer to the vicinity of the middle of the first current path 12, and compared with a case where the magnetic sensor (magnetoelectric conversion element) 910 is disposed in an outer side portion of the conductor to be measured (current path) 901 in such a manner as the related art, it is possible to reduce the influence of an external magnetizing field from a neighboring current path or the like.

In addition, a metal plate may be bent, thereby integrally forming the first flat-shaped portion 12f and the first convex portion 12w. Therefore, at the time of manufacturing, it is possible to easily manufacture the first flat-shaped portion 12f and the first convex portion 12w from one metal plate. From this, it is possible to reduce the cost of the current sensor 101.

[Second Embodiment]

Figure 10:
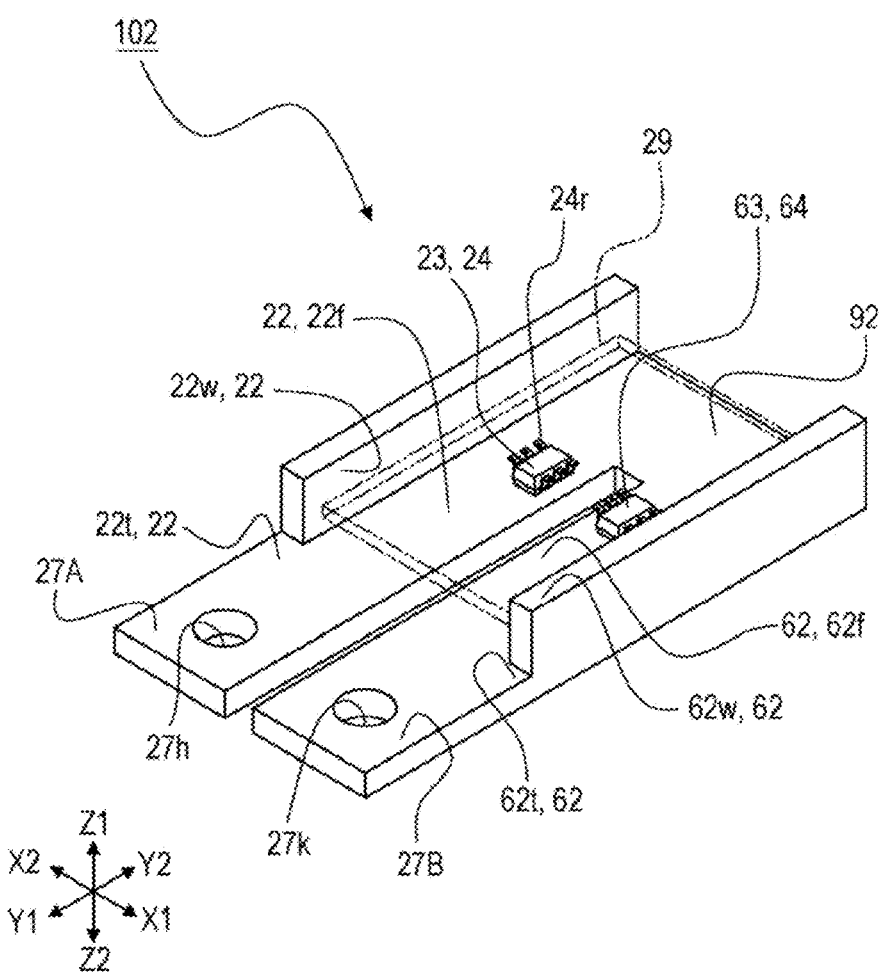
FIG. 10 is a perspective view explaining the current sensor of the second embodiment of the present invention.
Figure 11:
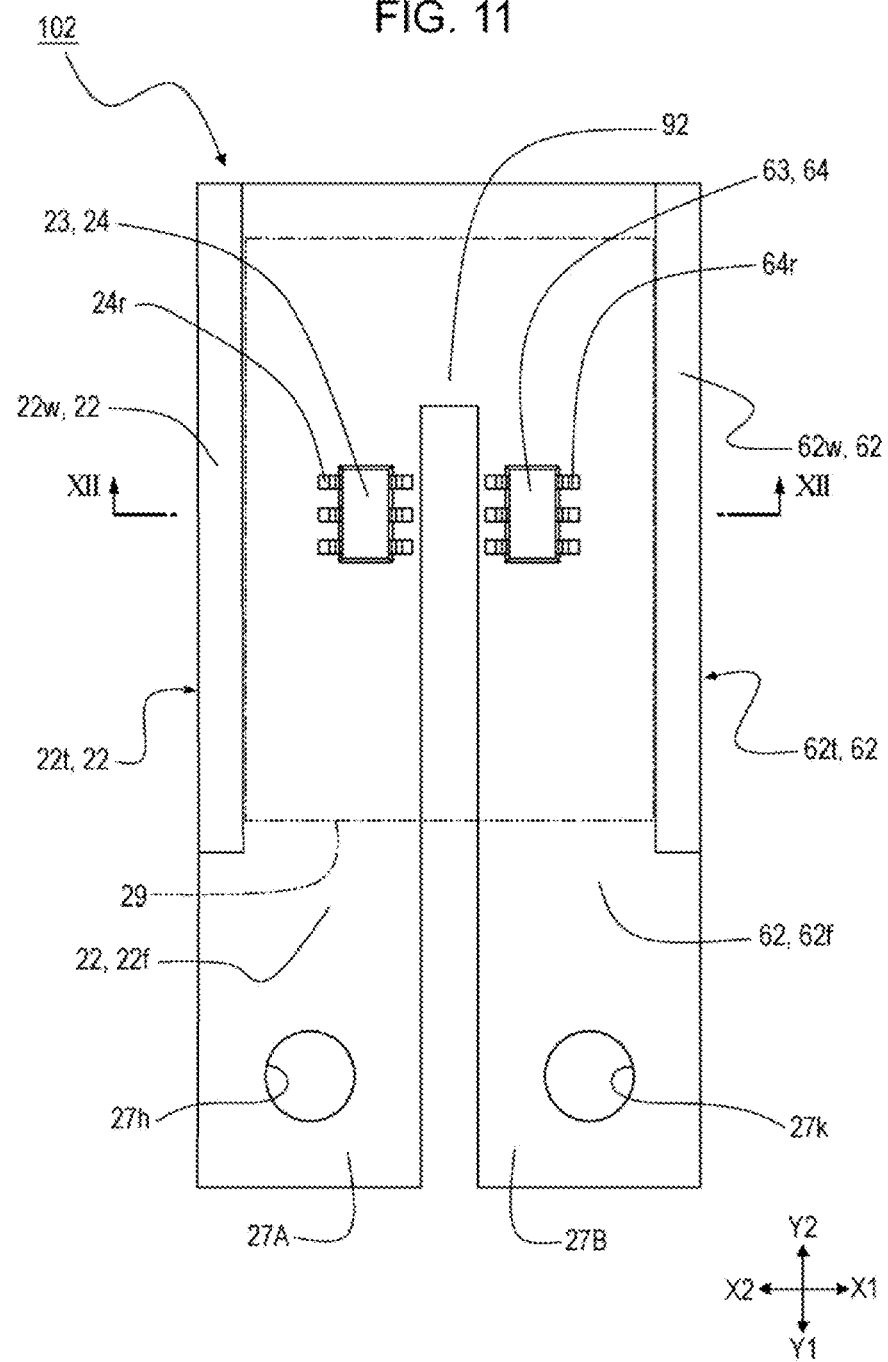
FIG. 11 is a configuration diagram explaining the current sensor of the second embodiment of the present invention and is a top view viewed from a Z1 side illustrated in FIG. 10.
Figure 12:
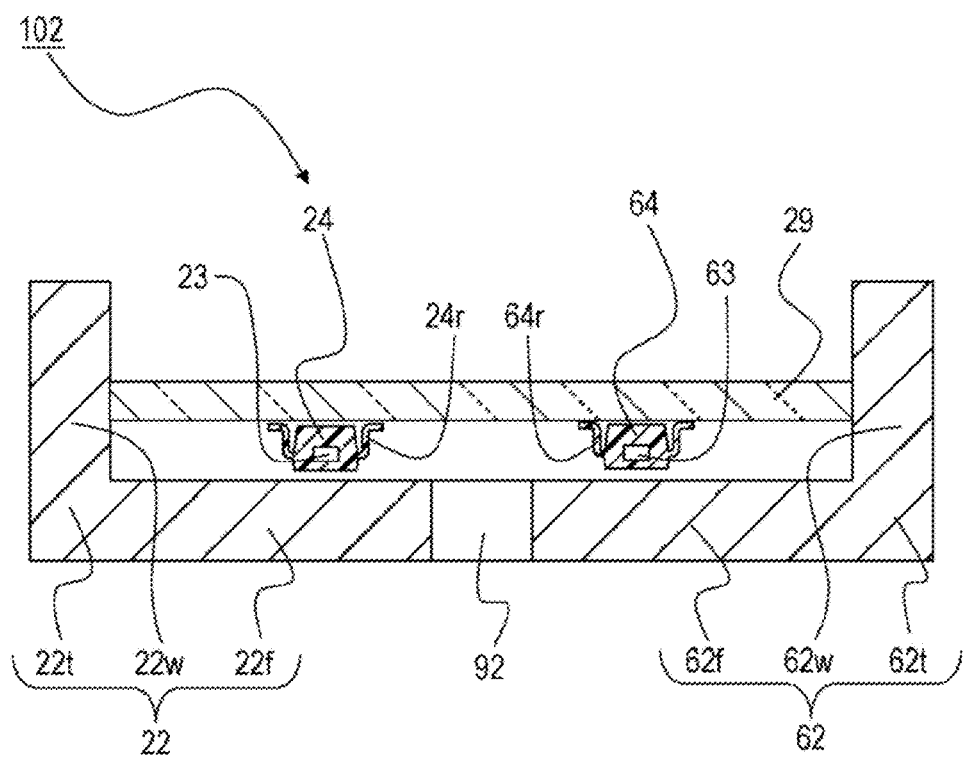
FIG. 12 is a configuration diagram explaining the current sensor of the second embodiment of the present invention and is a cross-sectional view taken along a line XII-XII illustrated in FIG. 11.

FIG. 9 is an exploded perspective view explaining a current sensor 102 of a second embodiment of the present invention. FIG. 10 is a perspective view explaining the current sensor 102 of the second embodiment of the present invention. FIG. 11 is a configuration diagram explaining the current sensor 102 of the second embodiment of the present invention and is a top view viewed from a Z1 side illustrated in FIG. 10. Note that, in FIG. 10 and FIG. 11, for ease of explanation, a substrate 29 is made transparent. FIG. 12 is a configuration diagram explaining the current sensor 102 of the second embodiment of the present invention and is a cross-sectional view taken along a line XII-XII illustrated in FIG. 11. In addition, the current sensor 102 of the second embodiment is different from the first embodiment in that a second current path 62 and a second magnetoelectric conversion element 63 may be provided. Note that a same symbol is assigned to the same configuration as that of the first embodiment and the detailed description thereof will be omitted.

As illustrated in FIG. 9 to FIG. 12, the current sensor 102 of the second embodiment of the present invention may include the first current path 22 including the first flat-shaped portion 22f, the second current path 62 including a second flat-shaped portion 62f, a connection portion 92 connecting one of ends of the first current path 22 and one of ends of the second current path 62 to each other, a first magnetoelectric conversion element 23 arranged on the first current path 22, and the second magnetoelectric conversion element 63 arranged on the second current path 62. In addition to this, the substrate 29 arranged so as to face the first current path 22 and the second current path 62, and a connector, connected to an external control device so as to supply electric power to the current sensor 102 and extract a signal from the current sensor 102 while not illustrated, may be provided.

Using a metallic material with a good conductive property such as copper (Cu), the first current path 22 may be configured to include the first flat-shaped portion 22f and a first convex portion 22w provided to stand from one of end portions 22t of the first current path 22, as illustrated in FIG. 9 to FIG. 12. In addition, this first convex portion 22w may be formed in a direction in which a current to be measured flows (a Y direction illustrated in FIG. 10).

In addition, as illustrated in FIG. 9 to FIG. 11, a terminal portion 27A is provided so as to be continuous with the first current path 22, on the other end side of the first current path 22. In addition, in this terminal portion 27A, a through hole 27h used for connecting to and fixing a current path to be measured (a current path intended to be measured) of a device (device to be measured) not illustrated is provided.

Using a metallic material with a good conductive property such as copper (Cu), the second current path 62 may be configured to include the second flat-shaped portion 62f and a second convex portion 62w provided to stand from one of end portions 62t of the second current path 62, as illustrated in FIG. 9 to FIG. 12. In addition, this second convex portion 62w may be formed in a direction in which the current to be measured flows (the Y direction illustrated in FIG. 10).

In addition, as illustrated in FIG. 9 to FIG. 11, a terminal portion 27B is provided so as to be continuous with the second current path 62, on the other end side of the second current path 62. In addition, in this terminal portion 27B, a through hole 27k used for connecting to and fixing a current path to be measured (a current path intended to be measured) of a device (device to be measured) not illustrated is provided.

As illustrated in FIG. 9 to FIG. 11, the first current path 22 and the second current path 62 may be disposed in parallel and one of ends of the first current path 22 and one of ends of the second current path 62 may be connected to each other by the connection portion 92. At that time, the first convex portion 22w of the first current path 22 may be provided to stand from one of the end portions 22t, located on a side farther away from the second current path 62, and the second convex portion 62w of the second current path 62 may be provided to stand from one of the end portions 62t, located on a side farther away from the first current path 22. In addition, the first convex portion 22w and the second convex portion 62w are arranged so as to face each other. Note that, in the second embodiment of the present invention, the first current path 22, the second current path 62, and the connection portion 92 form a U-shape and the first current path 22 and the second current path 62 are line-symmetrical to each other.

In addition, a metal plate such as a copper (Cu) may be bent, thereby integrally forming the first flat-shaped portion 22f, the first convex portion 22w, the connection portion 92, the second flat-shaped portion 62f, and the second convex portion 62w, described above. From this, at the time of manufacturing, it is possible to easily manufacture the first flat-shaped portion 22f, the first convex portion 22w, the connection portion 92, the second flat-shaped portion 62f, and the second convex portion 62w from one metal plate. From this, it is possible to reduce the cost of the current sensor 102.

The first magnetoelectric conversion element 23 may be an element for detecting magnetism generated when the current to be measured flows through the first current path 22, and the first magnetoelectric conversion element 23 is packaged into a magnetic sensor package 24 using, for example, a magnetoresistance effect element (called a giant magneto resistive (GMR) element) utilizing a giant magnetoresistance effect, as illustrated in FIG. 12. In addition, as illustrated in FIG. 10 to FIG. 12, the first magnetoelectric conversion element 23 may be arranged on a portion of the first flat-shaped portion 22f, from which the first convex portion 22w is provided to stand. In addition, the sensitivity direction of the first magnetoelectric conversion element 23 is arranged so as to face in an X direction illustrated in FIG. 11.

The second magnetoelectric conversion element 63 may be an element for detecting magnetism generated when the current to be measured flows through the second current path 62, and in the same way as the first magnetoelectric conversion element 23, the second magnetoelectric conversion element 63 is packaged into a magnetic sensor package 64 using, for example, a magnetoresistance effect element (called a giant magneto resistive (GMR) element) utilizing a giant magnetoresistance effect, as illustrated in FIG. 12. In addition, as illustrated in FIG. 10 to FIG. 12, the second magnetoelectric conversion element 63 may be arranged on a portion of the second flat-shaped portion 62f, from which the second convex portion 62w is provided to stand. In addition, the sensitivity direction of the second magnetoelectric conversion element 63 is arranged so as to face in the X direction illustrated in FIG. 11. In addition, since differential processing is performed using the first magnetoelectric conversion element 23 and the second magnetoelectric conversion element 63, the first magnetoelectric conversion element 23 and the second magnetoelectric conversion element 63 are arranged so that the individual directions of the sensitivity axes thereof face in a same direction.

After the GMR elements are manufactured on a silicon substrate, cut-out chips of the GMR elements and lead terminals (24r, 64r) for extracting signals are electrically connected and subjected to packaging using a thermosetting synthetic resin, thereby manufacturing the above-mentioned magnetic sensor packages (24, 64). In addition, the magnetic sensor package 24 and the magnetic sensor package 64 may be soldered to the substrate 29 serving as a circuit substrate by the lead terminals (24r, 64r) and provided on the same substrate 29. In addition, the magnetic sensor package 24 and the magnetic sensor package 64 are connected to the external control device through wiring patterns and the connector, not illustrated. Note that while the first magnetoelectric conversion element 23 and the second magnetoelectric conversion element 63 are subjected to packaging and arranged, as the magnetic sensor packages (24, 64), in the substrate 29, the first magnetoelectric conversion element 23 and the second magnetoelectric conversion element 63 may be arranged, for example, without change, in other words, may be subjected to so-called bare chip mounting and arranged on the same substrate 29.

In the substrate 29, a widely-known general double-sided printed wiring board is used, and a wiring pattern is formed in a base substrate made of a glass-added epoxy resin by subjecting a metal foil such as copper (Cu), provided on the base substrate, to patterning. As illustrated in FIG. 11 and FIG. 12, in the substrate 29, two magnetic sensor packages (24, 64) into which the first magnetoelectric conversion element 23 are the second magnetoelectric conversion element 63 are packaged, respectively, are mounted. Note that while the printed wiring board made of a glass-added epoxy resin is used for the substrate 29, not only this but also, for example, a ceramic wiring board or a flexible wiring board may be used. In addition, while, in the second embodiment of the present invention, the circuit substrate is suitably used as the substrate 29, not only the circuit substrate but also a structure may be adopted in which a circuit substrate is stacked on the substrate 29 and the magnetic sensor packages (24, 64) are mounted thereon.

Figure 13:
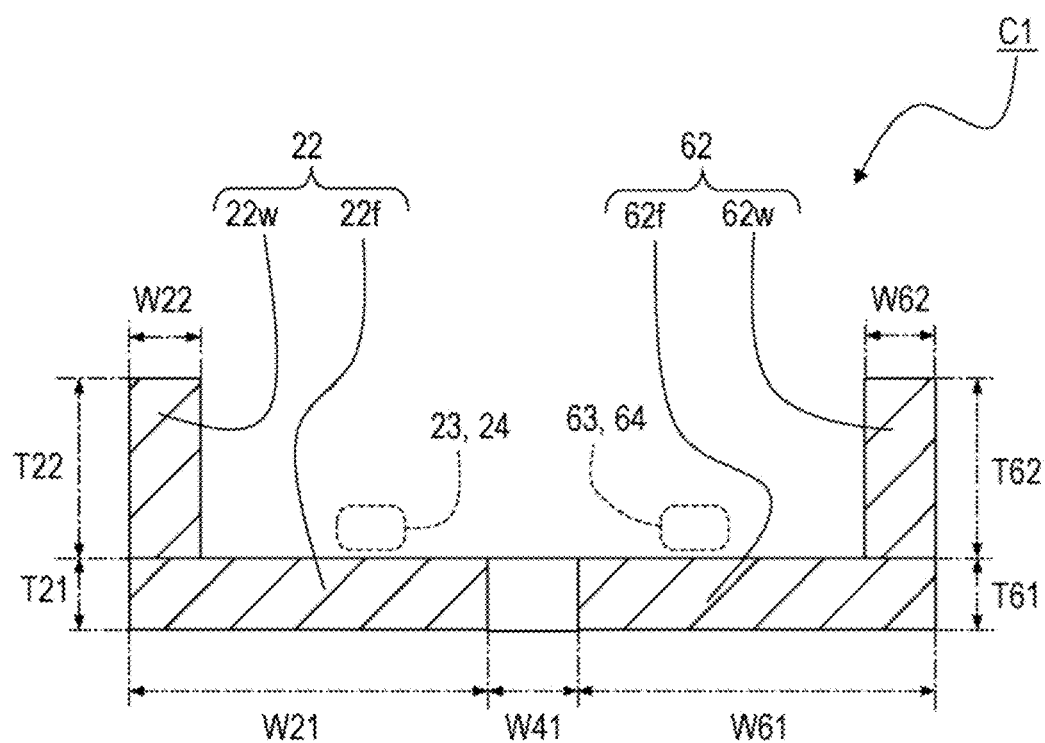
FIG. 13 is a cross-sectional view of a first current path and a second current path of a model used in a simulation of the current sensor of the second embodiment of the present invention.

Regarding the current sensor 102 configured as above, magnetizing field analysis utilizing a finite element analysis system was performed with respect to a change in a magnetizing field in a case where a current to be measured whose frequency was different flowed. FIG. 13 is the cross-sectional view of the first current path 22 and the second current path 62 of a model C1 used in a simulation of the current sensor of the second embodiment of the present invention.

As for numerical values used in the simulation (see FIG. 13), the entire length of the first current path 22 was set to 100 (mm), the entire width W21 thereof was set to 20 (mm), the thickness T21 of the first flat-shaped portion 22f was set to 4 (mm), the length of the first convex portion 22w was set to 60 (mm), the width W22 thereof was set to 4 (mm), and the height T22 thereof was set to 10 (mm). On the other hand, the entire length of the second current path 62 was set to 100 (mm), the entire width W61 thereof was set to 20 (mm), the thickness T61 of the second flat-shaped portion 62f was set to 4 (mm), the length of the second convex portion 62w was set to 60 (mm), the width W62 thereof was set to 4 (mm), and the height T62 thereof was set to 10 (mm). In addition, a distance W41 between the first current path 22 and the second current path 62 was set to 5 (mm). In addition, a magnetic flux density in a space 1 (mm) away from the surface of the first current path 22 or the second current path 62 was adopted. In addition, the current sensor 102 illustrated in FIG. 9 to FIG. 12 embodies this model C1.

Figure 14:
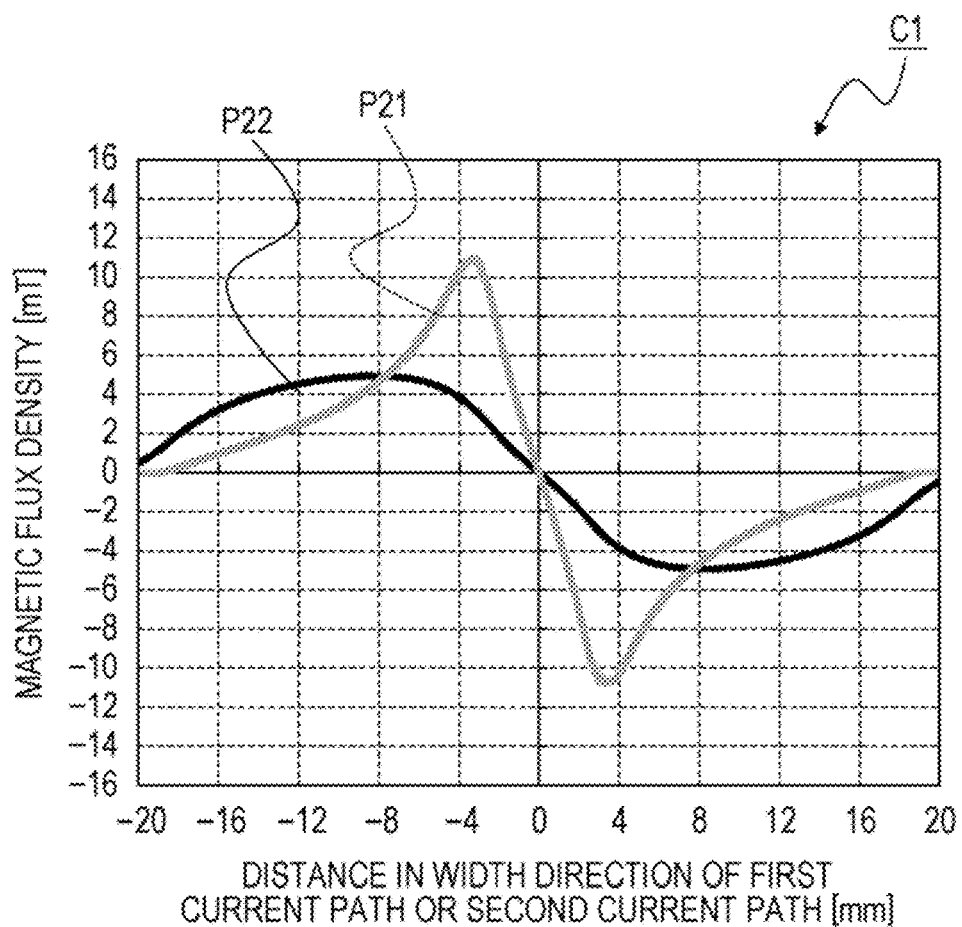
FIG. 14 is a graph illustrating a simulation result of the current sensor of the second embodiment of the present invention.

In addition, FIG. 14 is a simulation result of the model C1 of the current sensor of the second embodiment of the present invention. A horizontal axis in a graph in FIG. 14 indicates a distance in a width direction at the time of assuming that an intermediate point between the first current path 22 and the second current path 62 is zero, a minus side corresponds to the first current path 22, and a plus side corresponds to the second current path 62. In addition, a vertical axis in the graph in FIG. 14 indicates a magnetic flux density in a portion in which the first convex portion 22w of the first flat-shaped portion 22f or the second convex portion 62w of the second flat-shaped portion 62f is not provided. In addition, P21 in the drawing indicates a minimum frequency magnetic flux density in a case of a minimum frequency where the frequency of a current to be measured used in a device (device to be measured) is assumed to be 10 (Hz), and P22 in the drawing indicates a maximum frequency magnetic flux density in a case of a maximum frequency where the frequency of the current to be measured used in the device (device to be measured) is assumed to be 10 (kHz).

As a result, compared with a case where a large difference in the magnetic flux density is generated by a difference between the low frequency and the high frequency of the current to be measured in such a manner as in FIG. 26B, a difference in the magnetic flux density, due to a difference between the low frequency and the high frequency of the current to be measured, in other words, a difference between the minimum frequency magnetic flux density P21 and the maximum frequency magnetic flux density P22, became small above the first flat-shaped portion 22f in which the first convex portion 22w of the first current path 22 is not provided, as illustrated in FIG. 14 (on the minus side). It is conceivable that the reason is that a magnetizing field around the first current path 22 was changed by providing the first convex portion 22w. Accordingly, by providing the first conductive convex portion 22w in a direction in which the current to be measured flows, it is possible for the minimum frequency magnetic flux density P21 and the maximum frequency magnetic flux density P22 to be brought close to each other and caused to line up more with each other.

In addition, as illustrated in FIG. 14 (on the plus side), in the second current path 62, a difference in the magnetic flux density, due to a difference between the low frequency and the high frequency of the current to be measured, in other words, a difference between the minimum frequency magnetic flux density P21 and the maximum frequency magnetic flux density P22, became small above the second flat-shaped portion 62f in which the second convex portion 62w is not provided. It is conceivable that the reason is that a magnetizing field around the second current path 62 was changed by providing the second convex portion 62w. Accordingly, by providing the second conductive convex portion 62w in a direction in which the current to be measured flows, it is possible for the minimum frequency magnetic flux density P21 and the maximum frequency magnetic flux density P22 to be brought close to each other and caused to line up more with each other.

From the above, it is preferred that the first magnetoelectric conversion element 23 and the second magnetoelectric conversion element 63 are arranged at respective positions on the first current path 22 and the second current path 62, at which the minimum frequency magnetic flux density P21 and the maximum frequency magnetic flux density P22 substantially coincide with each other. For example, in a case of such a model C1 as illustrated in FIG. 14, it is preferable that, on the first flat-shaped portion 22f in which the first convex portion 22w of the first current path 22 is not provided, the first magnetoelectric conversion element 23 is arranged at a position whose distance from the center is about −7.5 (mm) (about 5 (mm) away from the other end portion of the first current path 22). In addition, it is preferable that, on the second flat-shaped portion 62f in which the second convex portion 62w of the second current path 62 is not provided, the second magnetoelectric conversion element 63 is arranged at a position whose distance from the center is about 7.5 (mm) (about 5 (mm) away from the other end portion of the second current path 62). Since, in the current sensor 102 of the present invention, in this way, it is possible to arrange each of the first magnetoelectric conversion element 23 and the second magnetoelectric conversion element 63 at a position at which a change in the magnetic flux density associated with a change in the frequency is small, the minimum frequency magnetic flux density P21 and the maximum frequency magnetic flux density P22 are not widely different from each other even if the frequency of the current to be measured changes. Therefore, it is possible to accurately measure a current value.

Furthermore, since the first magnetoelectric conversion element 23 and the second magnetoelectric conversion element 63 may be used and individually provided on the same substrate 29, influences due to an external magnetic field or an internal magnetic field generated when a current flows through a current path (the first current path 22 and the second current path 62) appear, with equal strength, in the two magnetoelectric conversion elements (the first magnetoelectric conversion element 23 and the second magnetoelectric conversion element 63). Therefore, by subjecting outputs from the two magnetoelectric conversion elements (the first magnetoelectric conversion element 23 and the second magnetoelectric conversion element 63) to differential processing, it is possible to more correctly cancel out the influences of the magnetic field. From this, it is possible to reduce the deterioration of the measurement accuracy of the current sensor 102.

In addition, while easily estimated from a result illustrated in FIG. 14, it is possible to arbitrarily change a position at which a change in the magnetic flux density associated with a change in the frequency is small, by changing the height T22 and the width W22 of the first convex portion 22w of the first current path 22. From this, it is possible to arbitrarily set the desired arrangement position of the first magnetoelectric conversion element 23. In addition, while not illustrated, by changing the shape of the first convex portion 22w, for example, a length, the surface shape of a corner, or the like, it is possible to arbitrarily change a position at which a change in the magnetic flux density associated with a change in the frequency is small. In the same way, by changing the height T62 and the width W62 of the second convex portion 62w of the second current path 62, or alternatively the surface shape of a corner, or the like, it is possible to arbitrarily change a position at which a change in the magnetic flux density associated with a change in the frequency is small. From this, it is possible to arbitrarily set the desired arrangement position of the second magnetoelectric conversion element 63.

In addition, while it is preferred that the first magnetoelectric conversion element 23 is arranged at a position on the first current path 22, at which the minimum frequency magnetic flux density P21 and the maximum frequency magnetic flux density P22 substantially coincide with each other, the first magnetoelectric conversion element 23 may be arranged at a position on the first current path 22, which corresponds to a region in which the minimum frequency magnetic flux density P21 and the maximum frequency magnetic flux density P22 become comparable to each other. In a case of, for example, the model C1, the first magnetoelectric conversion element 23 may be arranged in a region in which the minimum frequency magnetic flux density P21 and the maximum frequency magnetic flux density P22 become comparable to each other, in other words, at a distance of −6 (mm) to −14 (mm) from the center or preferably a distance of −7 (mm) to −9 (mm) therefrom, as illustrated in FIG. 14 (on the minus side). In a case of, for example, the model C1, the second magnetoelectric conversion element 63 may be arranged at a distance of 6 (mm) to 14 (mm) from the center or preferably a distance of 7 (mm) to 9 (mm) therefrom, as illustrated in FIG. 14 (on the plus side). In this way, it is possible to provide the first convex portion 22w and the second convex portion 62w so as to widen a region in which the minimum frequency magnetic flux density P21 and the maximum frequency magnetic flux density P22 become comparable to each other. From this, it is possible to arbitrarily arrange the first magnetoelectric conversion element 23 and the second magnetoelectric conversion element 63 within the range of this region. Therefore, even in a case where a position at which the current sensor 102 may be disposed is restricted in, for example, use for vehicle installation, it is possible to arrange the first magnetoelectric conversion element 23 and the second magnetoelectric conversion element 63 at the best possible positions.

Advantageous effects in the current sensor 102 of the second embodiment configured as above will be described below.

In the current sensor 102 of the second embodiment of the present invention, the first conductive convex portion 22w long in a direction in which the current to be measured flows may be provided in the first current path 22. Therefore, the minimum frequency magnetic flux density P21 serving as a magnetic flux density in a case of passing the current to be measured of the minimum frequency used in a device (device to be measured) and the maximum frequency magnetic flux density P22 serving as a magnetic flux density in a case of passing the current to be measured of the maximum frequency may be brought close to each other and caused to line up more with each other. Therefore, it is possible to arrange the first magnetoelectric conversion element 23 at a position at which a change in the magnetic flux density associated with a change in the frequency is small. From this, the minimum frequency magnetic flux density P21 and the maximum frequency magnetic flux density P22 are not widely different from each other even if the frequency of the current to be measured changes. Therefore, it is possible to accurately measure a current value.

Furthermore, the second conductive convex portion 62w may be provided, in the second current path 62, in a direction in which the current to be measured flows. Therefore, the minimum frequency magnetic flux density P21 serving as a magnetic flux density in a case of passing the current to be measured of the minimum frequency used in the device and the maximum frequency magnetic flux density P22 serving as a magnetic flux density in a case of passing the current to be measured of the maximum frequency may be brought close to each other and caused to line up more with each other. Therefore, it is possible to arrange the second magnetoelectric conversion element 63 at a position at which a change in the magnetic flux density associated with a change in the frequency is small. From this, the minimum frequency magnetic flux density P21 and the maximum frequency magnetic flux density P22 are not widely different from each other even if the frequency of the current to be measured changes. Therefore, it is possible to accurately measure a current value in the second current path 62.

In addition, since the first magnetoelectric conversion element 23 and the second magnetoelectric conversion element 63 may be used and individually provided on the same substrate 29, influences due to an external magnetic field or an internal magnetic field generated when a current flows through the current path (the first current path 22 and the second current path 62) appear, with equal strength, in the two magnetoelectric conversion elements (the first magnetoelectric conversion element 23 and the second magnetoelectric conversion element 63). Therefore, by subjecting outputs from the two magnetoelectric conversion elements (the first magnetoelectric conversion element 23 and the second magnetoelectric conversion element 63) to differential processing, it is possible to more correctly cancel out the influences of the magnetic field. From this, it is possible to reduce the deterioration of the measurement accuracy of the current sensor 102.

In addition, a metal plate such as a copper (Cu) may be bent, thereby integrally forming the first flat-shaped portion 22f, the first convex portion 22w, the connection portion 92, the second flat-shaped portion 62f, and the second convex portion 62w. Therefore, at the time of manufacturing, it is possible to easily manufacture the first flat-shaped portion 22f, the first convex portion 22w, the connection portion 92, the second flat-shaped portion 62f, and the second convex portion 62w from one metal plate. From this, it is possible to reduce the cost of the current sensor 102.

[Third Embodiment]

Figure 15:
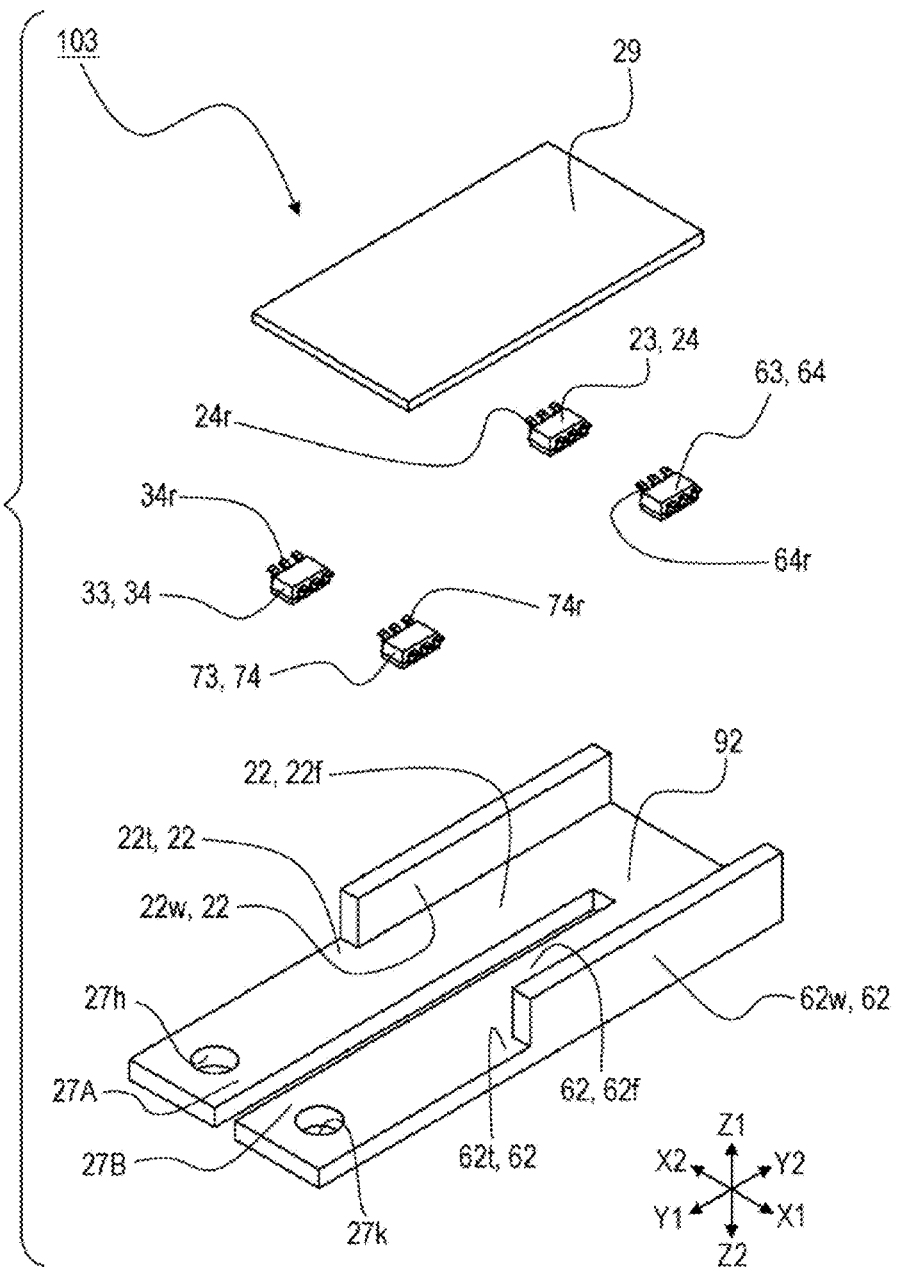
FIG. 15 is an exploded perspective view explaining a current sensor of a third embodiment of the present invention.
Figure 16:
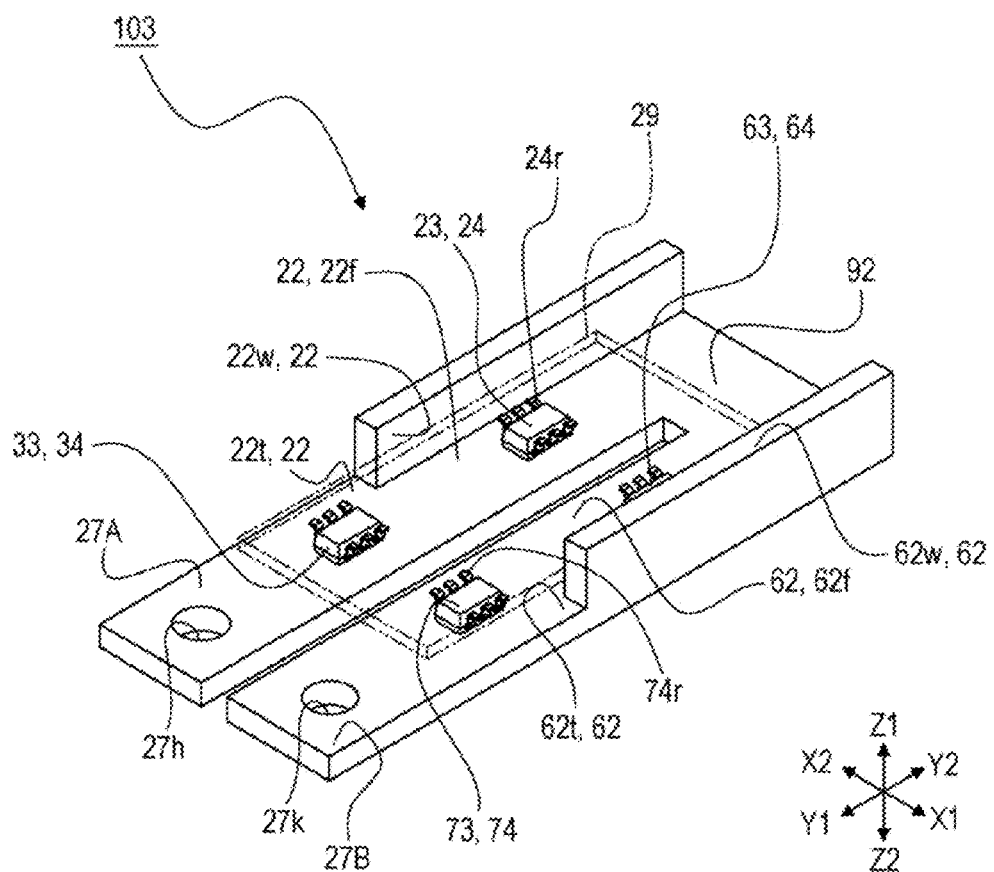
FIG. 16 is a perspective view explaining the current sensor of the third embodiment of the present invention.
Figure 18A:
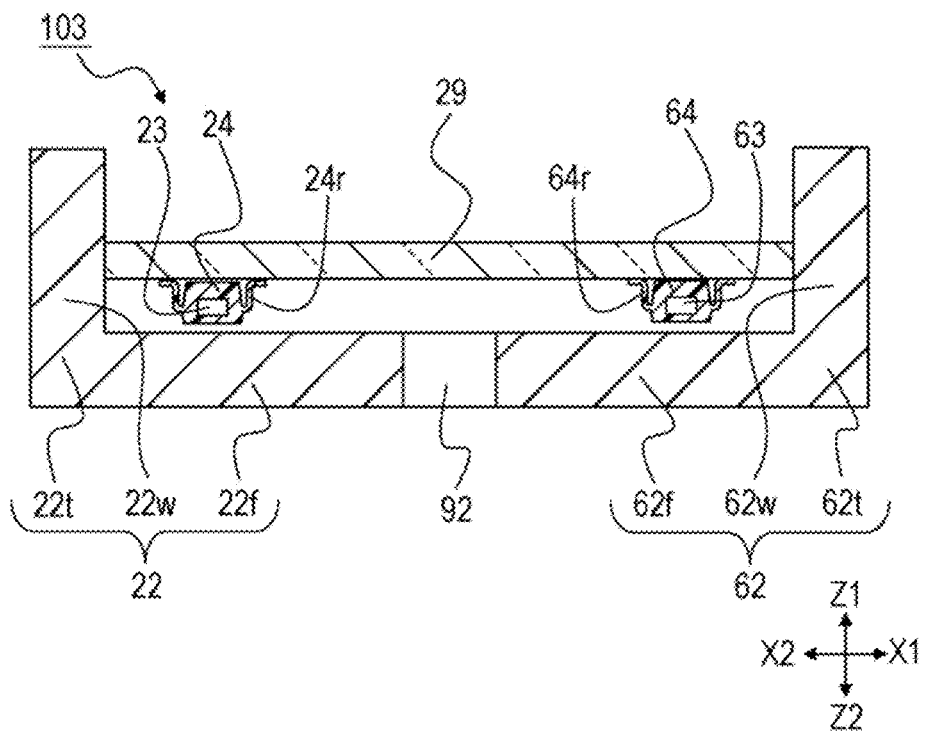
FIGS. 18A and 18B are configuration diagrams explaining the current sensor of the third embodiment of the present invention.
Figure 18B:
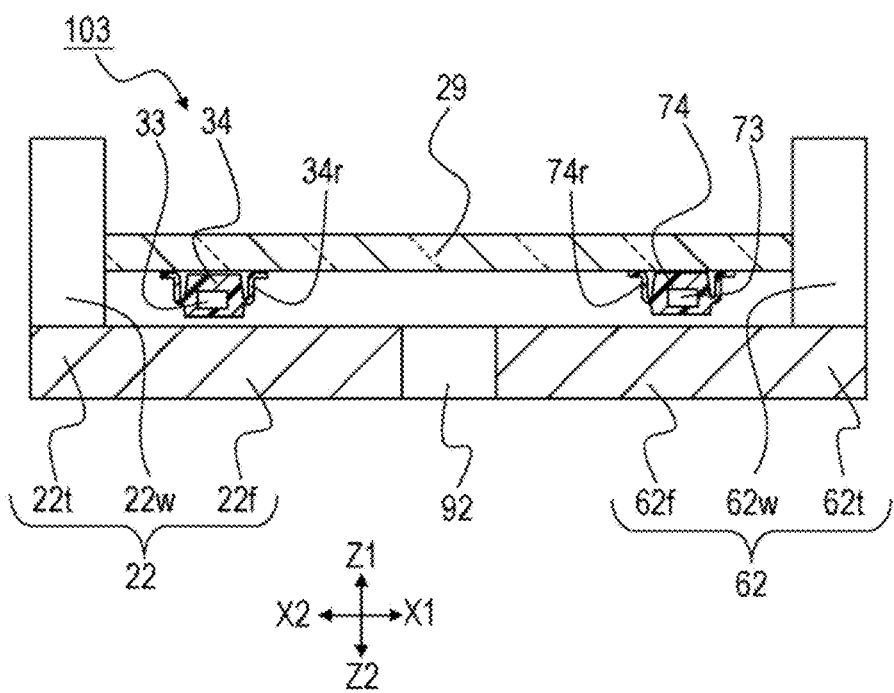

FIG. 15 is an exploded perspective view explaining a current sensor 103 of a third embodiment of the present invention. FIG. 16 is a perspective view explaining the current sensor 103 of the third embodiment of the present invention. FIG. 17 is a configuration diagram explaining the current sensor 103 of the third embodiment of the present invention and is a top view viewed from a Z1 side illustrated in FIG. 16. Note that, in FIG. 16 and FIG. 17, for ease of explanation, the substrate 29 is made transparent. FIGS. 18A and 18B are configuration diagrams explaining the current sensor 103 of the third embodiment of the present invention, FIG. 18A is a cross-sectional view taken along a line XVIIIA-XVIIIA illustrated in FIG. 17, and FIG. 18B is a cross-sectional view taken along a line XVIIIB-XVIIIB illustrated in FIG. 17. In addition, the current sensor 103 of the third embodiment is different from the second embodiment in that a first magnetoelectric conversion element 33 and a second magnetoelectric conversion element 73 are provided. Note that a same symbol is assigned to the same configuration as that of the first embodiment or the second embodiment and the detailed description thereof will be omitted.

As illustrated in FIG. 15 to FIGS. 18A and 18B, the current sensor 103 of the third embodiment of the present invention may include the first current path 22 including the first flat-shaped portion 22f, the second current path 62 including the second flat-shaped portion 62f, the connection portion 92 connecting one of the ends of the first current path 22 and one of the ends of the second current path 62 to each other, the first magnetoelectric conversion element 23 and the first magnetoelectric conversion element 33, arranged on the first current path 22, and the second magnetoelectric conversion element 63 and the second magnetoelectric conversion element 73, arranged on the second current path 62. In addition to this, the substrate 29 arranged so as to face the first current path 22 and the second current path 62, and a connector, connected to an external control device so as to supply electric power to the current sensor 103 and extract a signal from the current sensor 103 while not illustrated, may be provided.

Since the first current path 22, the second current path 62, and the connection portion 92 each have the same structure as that in the second embodiment, the description thereof here will be omitted.

As illustrated in FIG. 16 and FIG. 17, the first magnetoelectric conversion element 23 may be arranged on a first position 22a of the first flat-shaped portion 22f, from which the first convex portion 22w is provided to stand. In addition, the sensitivity direction of the first magnetoelectric conversion element 23 is arranged so as to face in an X direction illustrated in FIG. 17.

The first magnetoelectric conversion element 33 may be an element for detecting magnetism generated when the current to be measured flows through the first current path 22, and the first magnetoelectric conversion element 33 is packaged into a magnetic sensor package 34 using, for example, a magnetoresistance effect element (called a giant magneto resistive (GMR) element) utilizing a giant magnetoresistance effect, as illustrated in FIGS. 18A and 18B. In addition, as illustrated in FIG. 16 and FIG. 17, the first magnetoelectric conversion element 33 may be arranged on a third position 22c of the first flat-shaped portion 22f, from which the first convex portion 22w is not provided to stand. In addition, the sensitivity direction of the first magnetoelectric conversion element 33 is arranged so as to face in the X direction illustrated in FIG. 17, and faces in the same direction of the sensitivity axis as that of the first magnetoelectric conversion element 23.

As illustrated in FIG. 16 and FIG. 17, the second magnetoelectric conversion element 63 may be arranged on a second position 62b of the second flat-shaped portion 62f, from which the second convex portion 62w is provided to stand. In addition, the sensitivity direction of the second magnetoelectric conversion element 63 is arranged so as to face in the X direction illustrated in FIG. 17.

The second magnetoelectric conversion element 73 may be an element for detecting magnetism generated when the current to be measured flows through the second current path 62, and the second magnetoelectric conversion element 73 is packaged into a magnetic sensor package 74 using, for example, a magnetoresistance effect element (called a giant magneto resistive (GMR) element) utilizing a giant magnetoresistance effect, as illustrated in FIGS. 18A and 18B. In addition, as illustrated in FIG. 16 and FIG. 17, the second magnetoelectric conversion element 73 may be arranged on a fourth position 62d of the second flat-shaped portion 62f, from which the second convex portion 62w is not provided to stand. In addition, the sensitivity direction of the second magnetoelectric conversion element 73 is arranged so as to face in the X direction illustrated in FIG. 17, and faces in the same direction of the sensitivity axis as that of the second magnetoelectric conversion element 63.

After the GMR elements are manufactured on a silicon substrate, cut-out chips of the GMR elements and lead terminals (24r, 34r, 64r, 74r) for extracting signals are electrically connected and subjected to packaging using a thermosetting synthetic resin, thereby manufacturing the above-mentioned magnetic sensor packages (24, 34, 64, 74). In addition, the magnetic sensor packages (24, 34, 64, 74) may be soldered to the substrate 29 serving as a circuit substrate by the lead terminals (24r, 34r, 64r, 74r) and provided on the same substrate 29. In addition, the magnetic sensor packages (24, 34, 64, 74) are connected to the external control device through wiring patterns and the connector, not illustrated.

Regarding the current sensor 103 configured as above, magnetizing field analysis utilizing a finite element analysis system was performed with respect to a change in a magnetizing field in a case where a current to be measured whose frequency was different flowed.

Figure 19:
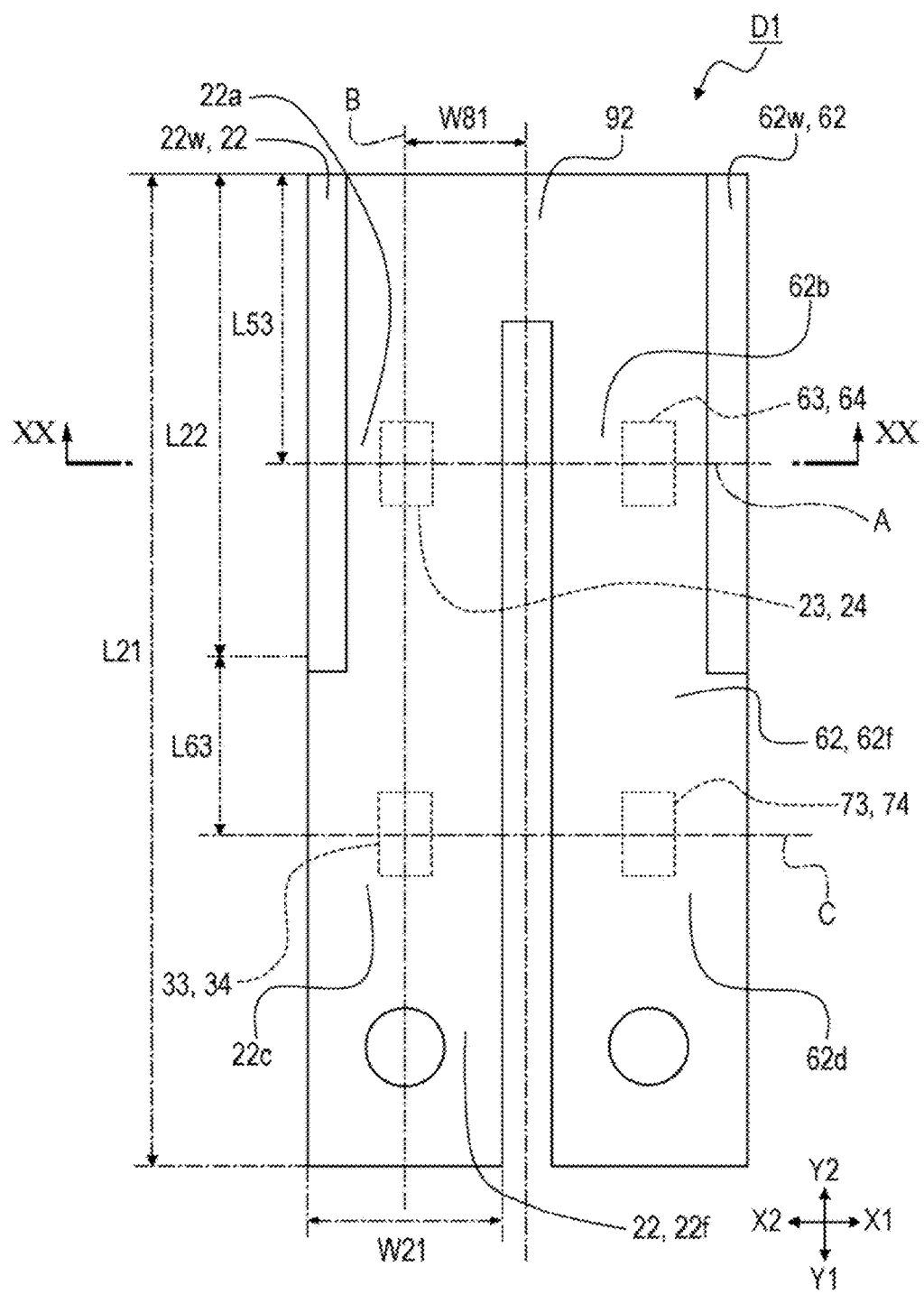
FIG. 19 is a plan view of a first current path, a second current path, and a connection portion in a model used in a simulation of the current sensor of the third embodiment of the present invention.
Figure 20:
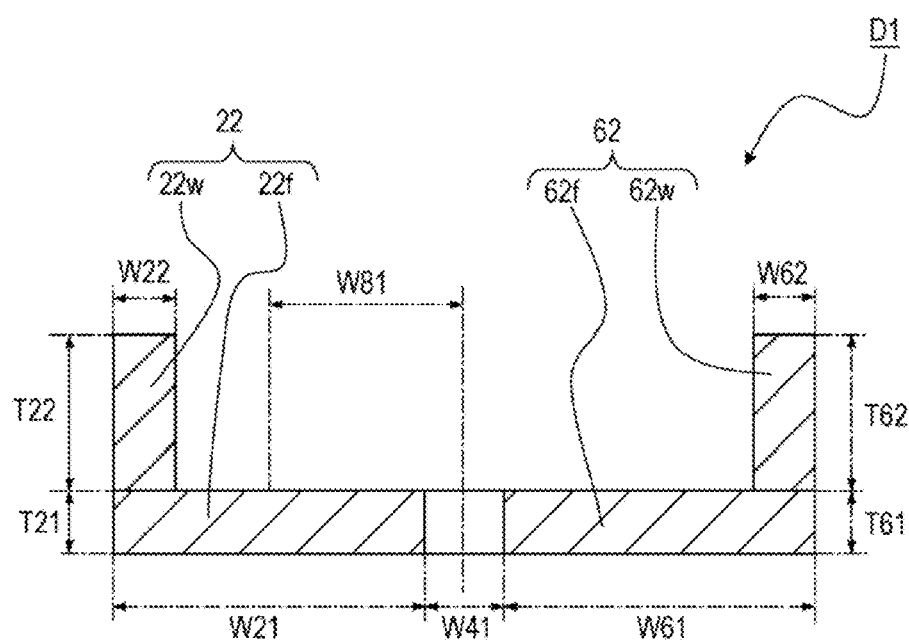
FIG. 20 is a cross-sectional view of the first current path and the second current path in the model used in a simulation of the current sensor of the third embodiment of the present invention and is a cross-sectional view taken along a line XX-XX illustrated in FIG. 19.
Figure 21:
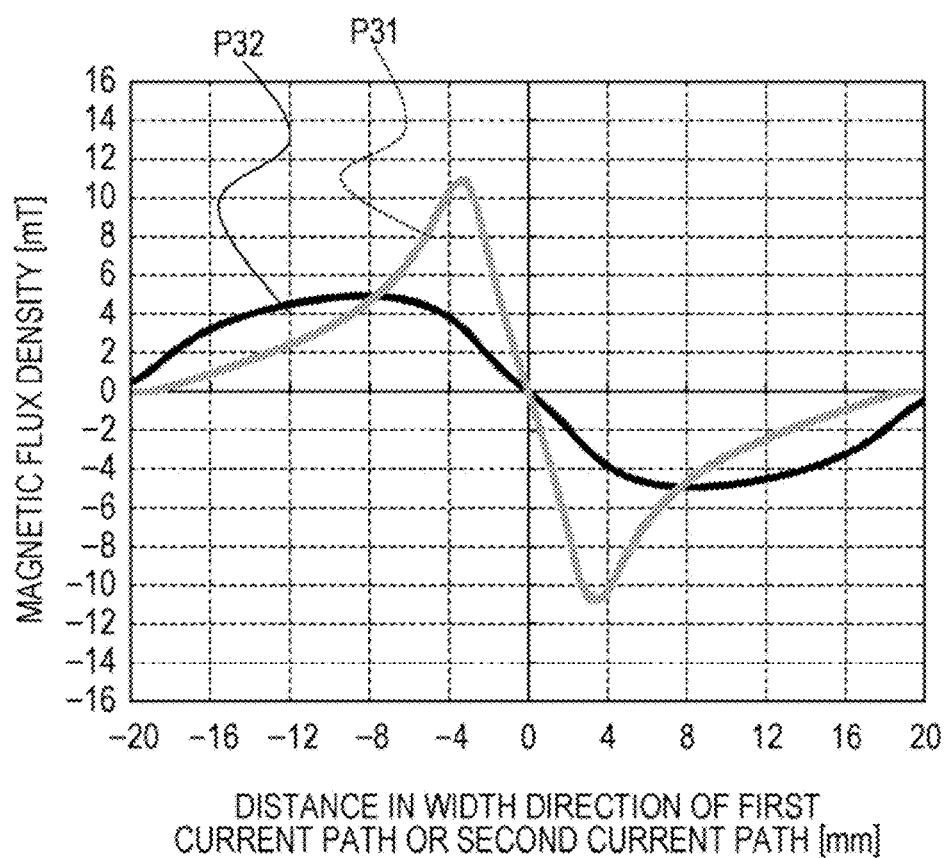
FIG. 21 is a simulation result of the current sensor of the third embodiment of the present invention and is a simulation result in a direction of a line A illustrated in FIG. 19.
Figure 22A:
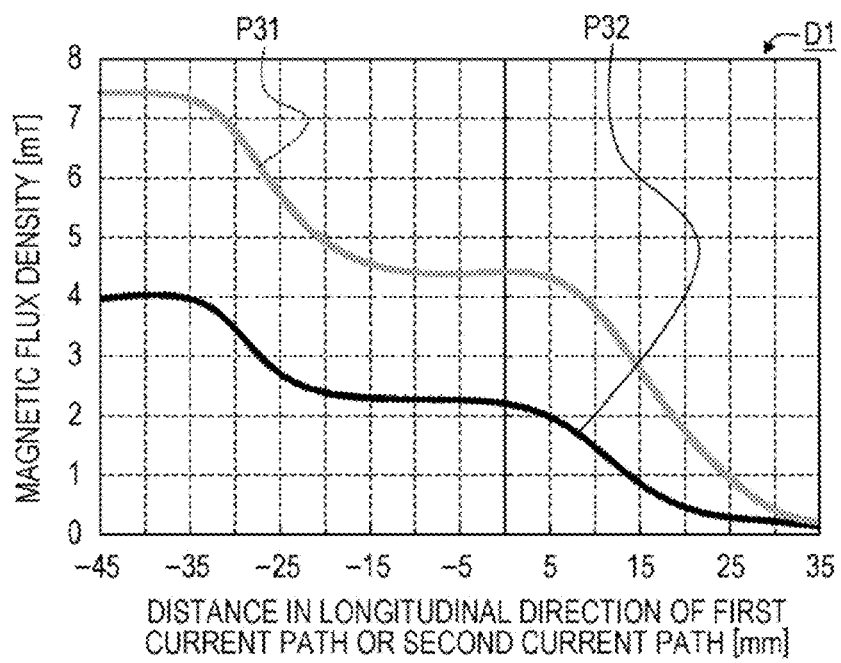
FIGS. 22A and 22B illustrate simulation results.
Figure 22B:
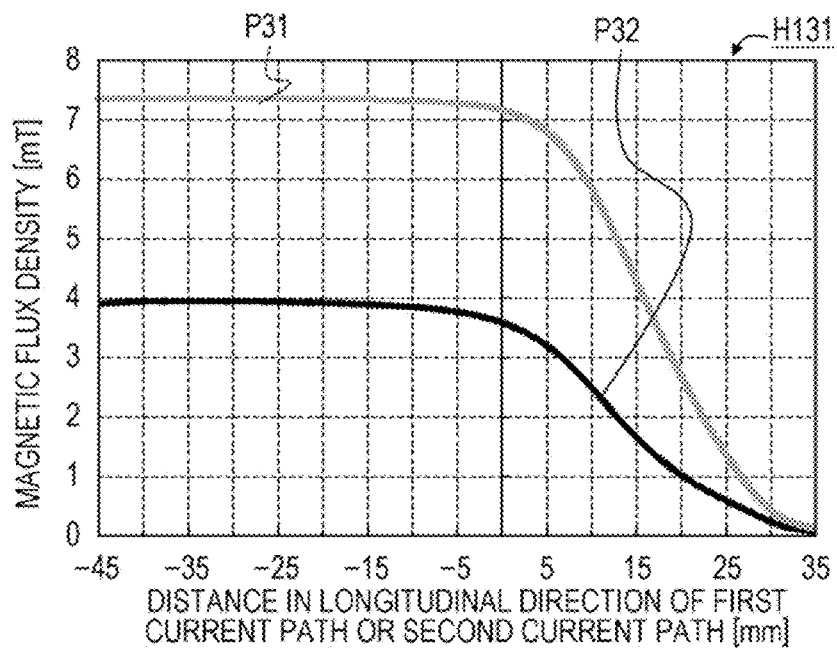

FIG. 19 is the plan view of the first current path 22, the second current path 62, and the connection portion 92 in a model D1 used in a simulation of the current sensor of the third embodiment of the present invention. FIG. 20 is the cross-sectional view of the first current path 22 and the second current path 62 in the model D1 used in a simulation of the current sensor of the third embodiment of the present invention and is a cross-sectional view taken along a line XX-XX illustrated in FIG. 19. FIG. 21 is a simulation result of the current sensor of the third embodiment of the present invention and is a simulation result in the direction of a line A illustrated in FIG. 19. FIGS. 22A and 22B illustrate simulation results, FIG. 22A is a simulation result in the direction of a line B illustrated in FIG. 19 in the current sensor of the third embodiment of the present invention, and FIG. 22B is a simulation result of a comparative example H131 compared with FIG. 22A. The comparative example H131 is a model in which the first convex portion 22w or the second convex portion 62w, illustrated in FIG. 19, does not exist. In addition, P31 in each of the drawings indicates a minimum frequency magnetic flux density in a case of a minimum frequency where the frequency of a current to be measured used in a device (device to be measured) is assumed to be 10 (Hz), and P32 in each of the drawings indicates a maximum frequency magnetic flux density in a case of a maximum frequency where the frequency of the current to be measured used in the device (device to be measured) is assumed to be 10 (kHz).

As for numerical values used in the simulation (see FIG. 19 and FIG. 20), the entire length L21 of the first current path 22 was set to 120 (mm), the entire width W21 thereof was set to 20 (mm), the thickness T21 of the first flat-shaped portion 22f was set to 4 (mm), the length L22 of the first convex portion 22w was set to 60 (mm), the width W22 thereof was set to 4 (mm), and the height T22 thereof was set to 4 (mm). On the other hand, the entire length of the second current path 62 was set to 100 (mm), the entire width W61 thereof was set to 20 (mm), the thickness T61 of the second flat-shaped portion 62f was set to 4 (mm), the length of the second convex portion 62w was set to 60 (mm), the width W62 thereof was set to 4 (mm), and the height T62 thereof was set to 4 (mm). In addition, a length L53 from one of the end portions of each of the first current path 22 and the second current path 62 to the line A was set to 40 (mm), and a length L63 from one of the end portions of each of the first convex portion 22w and the second convex portion 62w to a line C was set to 20 (mm). In other words, a length between the line A and the line C becomes 40 (mm). In addition, a length W81 from an intermediate point between the first current path 22 and the second current path 62 to the line B was set to 12.5 (mm). In addition, a distance W41 between the first current path 22 and the second current path 62 was set to 5 (mm). In addition, a magnetic flux density in a space 1 (mm) away from the surface of the first current path 22 or the second current path 62 was adopted. In addition, the current sensor 103 illustrated in FIG. 15 to FIGS. 18A and 18B embodies this model D1.

As a result, compared with a case where a large difference in the magnetic flux density is generated by a difference between the low frequency and the high frequency of the current to be measured in such a manner as in FIG. 26B, a difference in the magnetic flux density, due to a difference between the low frequency and the high frequency of the current to be measured, in other words, a difference between the minimum frequency magnetic flux density P31 and the maximum frequency magnetic flux density P32, became small above the first flat-shaped portion 22f in which the first convex portion 22w of the first current path 22 is not provided, as illustrated in FIG. 21 (on a minus side). It is conceivable that the reason is that a magnetizing field around the first current path 22 was changed by providing the first convex portion 22w. Accordingly, by providing the first conductive convex portion 22w in a direction in which the current to be measured flows, it is possible for the minimum frequency magnetic flux density P31 and the maximum frequency magnetic flux density P32 to be brought close to each other and caused to line up more with each other.

In addition, as illustrated in FIG. 21 (on a plus side), in the second current path 62, a difference in the magnetic flux density, due to a difference between the low frequency and the high frequency of the current to be measured, in other words, a difference between the minimum frequency magnetic flux density P31 and the maximum frequency magnetic flux density P32, became small above the second flat-shaped portion 62f in which the second convex portion 62w is not provided. It is conceivable that the reason is that a magnetizing field around the second current path 62 was changed by providing the second convex portion 62w. Accordingly, by providing the second conductive convex portion 62w in a direction in which the current to be measured flows, it is possible for the minimum frequency magnetic flux density P31 and the maximum frequency magnetic flux density P32 to be brought close to each other and caused to line up more with each other.

From this, it is preferred that the first magnetoelectric conversion element 23 and the second magnetoelectric conversion element 63 are arranged at respective positions on the first current path 22 and the second current path 62, at which the minimum frequency magnetic flux density P31 and the maximum frequency magnetic flux density P32 substantially coincide with each other. For example, in a case of such a model C1 as illustrated in FIG. 14, it is preferable that, on the first flat-shaped portion 22f in which the first convex portion 22w of the first current path 22 is not provided, the first magnetoelectric conversion element 23 is arranged at a position whose distance from the center is about −7.5 (mm) (about 5 (mm) away from the other end portion of the first current path 22). In addition, it is preferable that, on the second flat-shaped portion 62f in which the second convex portion 62w of the second current path 62 is not provided, the second magnetoelectric conversion element 63 is arranged at a position whose distance from the center is about 7.5 (mm) (about 5 (mm) away from the other end portion of the second current path 62). Since, in the current sensor 103 of the present invention, in this way, it is possible to arrange each of the first magnetoelectric conversion element 23 and the second magnetoelectric conversion element 63 at a position at which a change in the magnetic flux density associated with a change in the frequency is small, the minimum frequency magnetic flux density P31 and the maximum frequency magnetic flux density P32 are not widely different from each other even if the frequency of the current to be measured changes. Therefore, it is possible to accurately measure a current value.

Furthermore, since the first magnetoelectric conversion element 23 and the second magnetoelectric conversion element 63 may be used and individually provided on the same substrate 29, influences due to an external magnetic field or an internal magnetic field generated when a current flows through the current path (the first current path 22 and the second current path 62) appear, with equal strength, in the two magnetoelectric conversion elements (the first magnetoelectric conversion element 23 and the second magnetoelectric conversion element 63). Therefore, by subjecting outputs from the two magnetoelectric conversion elements (the first magnetoelectric conversion element 23 and the second magnetoelectric conversion element 63) to differential processing, it is possible to more correctly cancel out the influences of the magnetic field. From this, it is possible to reduce the deterioration of the measurement accuracy of the current sensor 103.

In addition, in a result illustrated in FIG. 22A, as for both the minimum frequency magnetic flux density P31 and the maximum frequency magnetic flux density P32, the magnetic flux density of a portion of the line A (0 (mm) in the drawing) is smaller than the magnetic flux density of a portion of the line C (−40 (mm) in the drawing). In other words, the magnetic flux density of the portion of the line A at the first position 22a from which the first convex portion 22w is provided to stand and the magnetic flux density of the portion of the line C at the third position 22c from which the first convex portion 22w is not provided to stand are widely different from each other. On the other hand, in a result of the comparative example H131 illustrated in FIG. 22B, as for both the minimum frequency magnetic flux density P31 and the maximum frequency magnetic flux density P32, the magnetic flux density of the portion of the line C (−40 (mm) in the drawing) and the magnetic flux density of the portion of the line A (0 (mm) in the drawing) are approximately equal to each other.

From this, the first magnetoelectric conversion element 23 may be arranged on the first position 22a of the first current path 22, from which the first convex portion 22w is provided to stand, and the first magnetoelectric conversion element 33 may be arranged on the third position 22c of the first current path 22, from which the first convex portion 22w is not provided to stand, thereby causing a difference in absolute quantity between a magnetic quantity detected by the first magnetoelectric conversion element 23 and a magnetic quantity detected by the first magnetoelectric conversion element 33. Therefore, it is possible to properly use, for measuring a high current, the first magnetoelectric conversion element 23 arranged at the first position 22a, and it is possible to properly use, for measuring a low current, the first magnetoelectric conversion element 33 arranged at the third position 22c. From this, it is possible to perform wide-range measurement for high current measurement, and it is possible to perform highly accurate measurement for low current measurement. In addition, in a case of such a model D1 as illustrated in FIG. 19 and FIG. 20, as illustrated in FIG. 22A, it is preferred that the arrangement position of the first magnetoelectric conversion element 23 is located at the first position 22a and falls within the range of −15 (mm) (5 (mm) away from one of the end portions of the first convex portion) to +5 (mm) and it is preferred that the arrangement position of the first magnetoelectric conversion element 33 is located at the third position 22c and located in a region −35 (mm) (15 (mm) away from one of the end portions of the first convex portion) or less away.

In addition, while not illustrated, the same applies to the second current path 62, and it is preferable that the second magnetoelectric conversion element 63 is arranged on the second position 62b of the second current path 62, from which the second convex portion 62w is provided to stand, and the second magnetoelectric conversion element 73 is arranged on the fourth position 62d of the second current path 62, from which the second convex portion 62w is not provided to stand. From this, a difference in absolute quantity between a magnetic quantity detected by the second magnetoelectric conversion element 63 and a magnetic quantity detected by the second magnetoelectric conversion element 73 is caused. Therefore, it is possible to properly use, for measuring a high current, the second magnetoelectric conversion element 63 arranged at the second position 62b, and it is possible to properly use, for measuring a low current, the second magnetoelectric conversion element 73 arranged at the fourth position 62d. From this, it is possible to perform wide-range measurement for high current measurement, and it is possible to perform highly accurate measurement for low current measurement.

Furthermore, since the first magnetoelectric conversion element 33 and the second magnetoelectric conversion element 73 may be used and individually provided on the same substrate 29, influences due to an external magnetic field or an internal magnetic field generated when a current flows through the current path (the first current path 22 and the second current path 62) appear, with equal strength, in the two magnetoelectric conversion elements (the first magnetoelectric conversion element 33 and the second magnetoelectric conversion element 73). Therefore, by subjecting outputs from the two magnetoelectric conversion elements (the first magnetoelectric conversion element 33 and the second magnetoelectric conversion element 73) to differential processing, it is possible to more correctly cancel out the influences of the magnetic field. From this, it is possible to reduce the deterioration of the measurement accuracy of the current sensor 103.

Advantageous effects in the current sensor 103 of the third embodiment configured as above will be described below.

In the current sensor 103 of the third embodiment of the present invention, the first conductive convex portion 22w long in a direction in which the current to be measured flows may be provided in the first current path 22. Therefore, the minimum frequency magnetic flux density P31 serving as a magnetic flux density in a case of passing the current to be measured of the minimum frequency used in a device (device to be measured) and the maximum frequency magnetic flux density P32 serving as a magnetic flux density in a case of passing the current to be measured of the maximum frequency may be brought close to each other and caused to line up more with each other. Therefore, it is possible to arrange the first magnetoelectric conversion element 23 at a position at which a change in the magnetic flux density associated with a change in the frequency is small. From this, the minimum frequency magnetic flux density P31 and the maximum frequency magnetic flux density P32 are not widely different from each other even if the frequency of the current to be measured changes. Therefore, it is possible to accurately measure a current value.

Furthermore, the second conductive convex portion 62w may be provided, in the second current path 62, in a direction in which the current to be measured flows. Therefore, the minimum frequency magnetic flux density P31 serving as a magnetic flux density in a case of passing the current to be measured of the minimum frequency used in the device and the maximum frequency magnetic flux density P32 serving as a magnetic flux density in a case of passing the current to be measured of the maximum frequency may be brought close to each other and caused to line up more with each other. Therefore, it is possible to arrange the second magnetoelectric conversion element 63 at a position at which a change in the magnetic flux density associated with a change in the frequency is small. From this, the minimum frequency magnetic flux density P31 and the maximum frequency magnetic flux density P32 are not widely different from each other even if the frequency of the current to be measured changes. Therefore, it is possible to accurately measure a current value in the second current path 62.

In addition, since the first magnetoelectric conversion element 23 and the second magnetoelectric conversion element 63 may be used and individually provided on the same substrate 29, influences due to an external magnetic field or an internal magnetic field generated when a current flows through the current path (the first current path 22 and the second current path 62) appear, with equal strength, in the two magnetoelectric conversion elements (the first magnetoelectric conversion element 23 and the second magnetoelectric conversion element 63). Therefore, by subjecting outputs from the two magnetoelectric conversion elements (the first magnetoelectric conversion element 23 and the second magnetoelectric conversion element 63) to differential processing, it is possible to more correctly cancel out the influences of the magnetic field. From this, it is possible to reduce the deterioration of the measurement accuracy of the current sensor 103.

In addition, the first magnetoelectric conversion element 23 and the second magnetoelectric conversion element 63, arranged at the first position 22a of the first current path 22, from which the first convex portion 22w is provided to stand, and the second position 62b of the second current path 62, from which the second convex portion 62w is provided to stand, respectively, and the first magnetoelectric conversion element 33 and the second magnetoelectric conversion element 73, arranged at the third position 22c of the first current path 22, from which the first convex portion 22w is not provided to stand, and the fourth position 62d of the second current path 62, from which the second convex portion 62w is not provided to stand, respectively, are each separately arranged. From this, differences in absolute quantity between respective magnetic quantities detected by the first magnetoelectric conversion element 23 and the second magnetoelectric conversion element 63 and respective magnetic quantities detected by the first magnetoelectric conversion element 33 and the second magnetoelectric conversion element 73 are caused, the first magnetoelectric conversion element 23 and the second magnetoelectric conversion element 63 being arranged at the first position 22a and the second position 62b, respectively, the first magnetoelectric conversion element 33 and the second magnetoelectric conversion element 73 being arranged at the third position 22c and the fourth position 62d, respectively. Therefore, it is possible to properly use, for measuring a high current, the first magnetoelectric conversion element 23 and the second magnetoelectric conversion element 63, arranged at the first position 22a and the second position 62b, respectively, and it is possible to properly use, for measuring a low current, the first magnetoelectric conversion element 33 and the second magnetoelectric conversion element 73, arranged at the third position 22c and the fourth position 62d, respectively. From this, it is possible to perform wide-range measurement for high current measurement, and it is possible to perform highly accurate measurement for low current measurement.

In addition, the present invention is not limited to the above-mentioned embodiments, may be modified and implemented, for example, as follows, and these embodiments belong to the technical scope of the present invention.

Figure 23A:
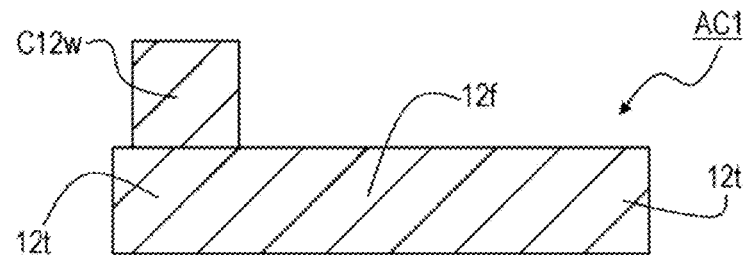
FIGS. 23A to 23D are diagrams explaining examples of modifications to the current sensor of the first embodiment of the present invention.
Figure 23B:
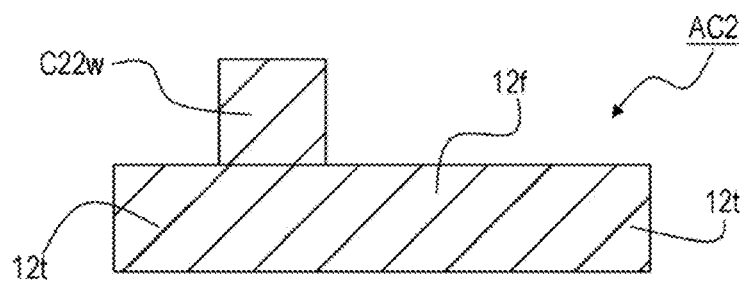
Figure 23C:
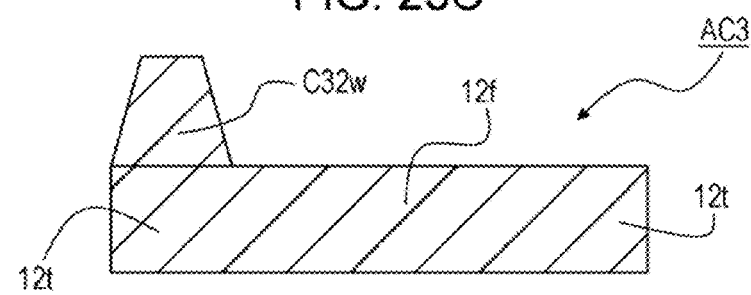
Figure 23D:
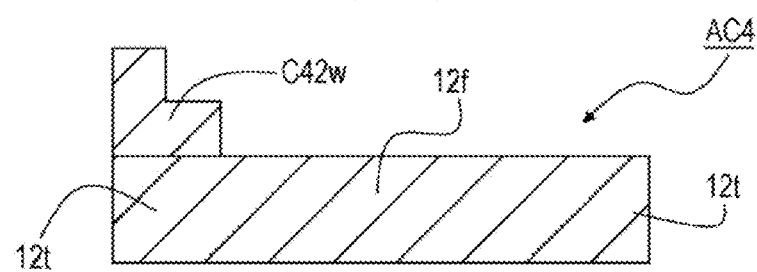
Figure 24A:
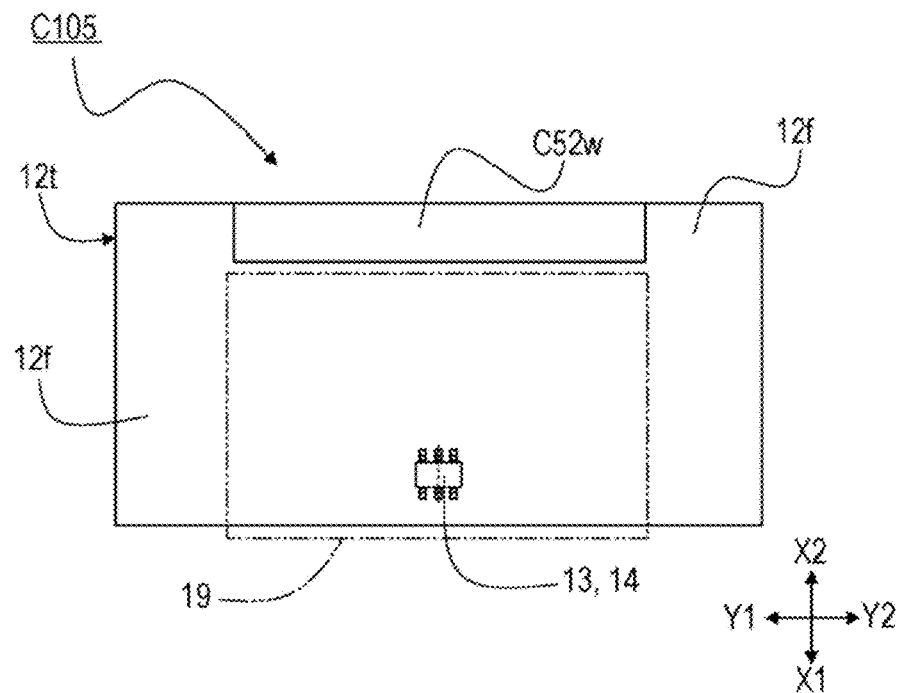
FIGS. 24A and 24B are diagrams explaining examples of modifications to the current sensor of the first embodiment of the present invention.
Figure 24B:
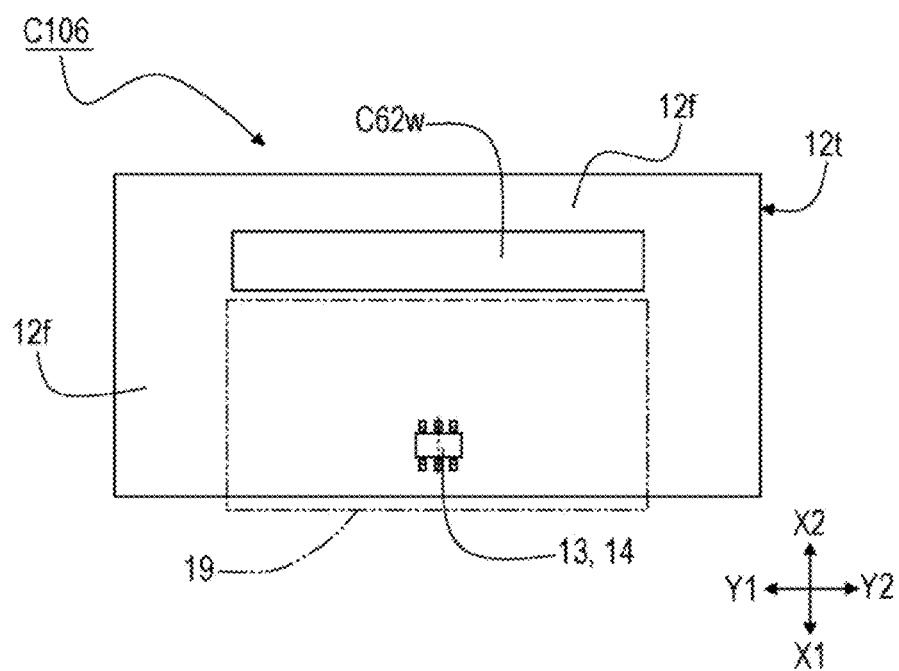
Figure 25A:
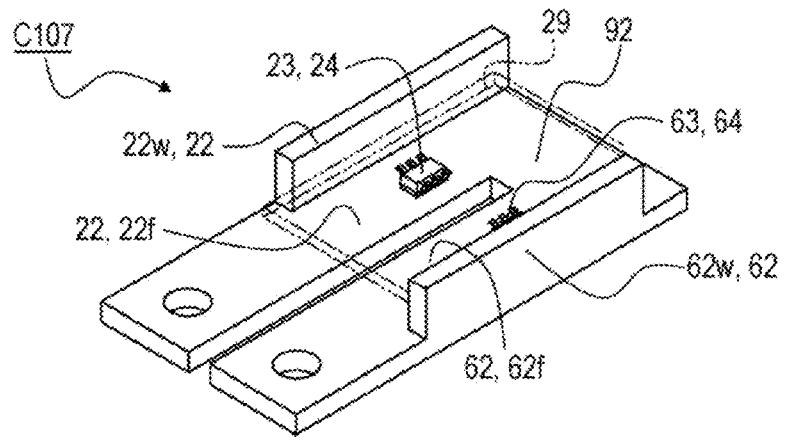
FIGS. 25A to 25C are diagrams explaining examples of modifications to the current sensor of the second embodiment of the present invention.
Figure 25B:
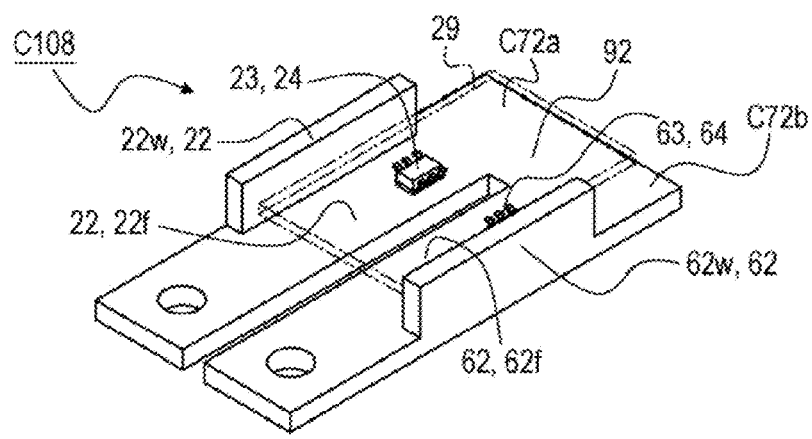
Figure 25C:
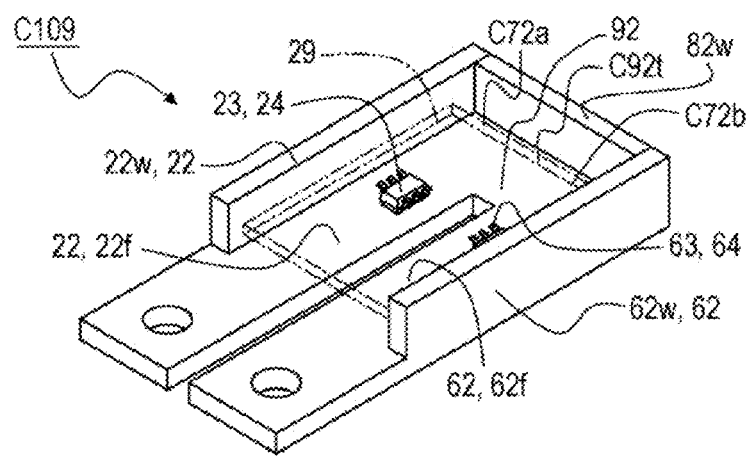

FIGS. 23A to 23D are diagrams explaining examples of modifications to the current sensor 101 of the first embodiment of the present invention, FIG. 23A is a model AC1 of a first example of a modification, FIG. 23B is a model AC2 of a second example of a modification, FIG. 23C is a model AC3 of a third example of a modification, and FIG. 23D is a model AC4 of a fourth example of a modification. FIGS. 24A and 24B are diagrams explaining examples of modifications to the current sensor 101 of the first embodiment of the present invention, FIG. 24A is the plan view of a current sensor C105 of a fifth example of a modification, and FIG. 24B is the plan view of a current sensor C106 of a sixth example of a modification. FIGS. 25A to 25C are diagrams explaining examples of modifications to the current sensor 102 of the second embodiment of the present invention, FIG. 25A is the perspective view of a current sensor C107 of a seventh example of a modification, FIG. 25B is the perspective view of a current sensor C108 of an eighth example of a modification, and FIG. 25C is the perspective view of a current sensor C109 of a ninth example of a modification.

<First Example of Modification><Second Example of Modification>

While the above-mentioned first embodiment is configured so that the first convex portion 12w is provided to stand from one of the end portions 12t of the first current path 12 and one of the end surfaces of the first flat-shaped portion 12f and one of the surfaces of the first convex portion 12w become flush with each other, a configuration may be adopted in which, as illustrated in FIG. 23A, a first convex portion C12w is provided to stand from one of the end portions 12t of the first current path 12 while one of the end surfaces of the first flat-shaped portion 12f and one of the surfaces of the first convex portion C12w are not flush with each other. In addition, a configuration may be adopted in which, as illustrated in FIG. 23B, a first convex portion C22w is not provided to stand from one of the end portions 12t of the first current path 12.

<Third Example of Modification><Fourth Example of Modification>

While the above-mentioned first embodiment is configured so that the cross-sectional shape of the first convex portion 12w is a rectangular shape, the cross-sectional shape of the first convex portion 12w is not limited to the rectangular shape, and may be configured in another shape. A first convex portion C32w of a trapezoidal shape may be adopted as illustrated in, for example, FIG. 23C, a first convex portion C42w of a shape having a level difference portion as illustrated in, for example, FIG. 23D, and furthermore, a shape may be formed in a staircase pattern.

<Fifth Example of Modification><Sixth Example of Modification>

While, in the above-mentioned first embodiment, a configuration in which the first convex portion 12w is provided over the entire length in the longitudinal direction of the first current path 12 is adopted, a configuration in which, as illustrated in FIG. 24A, a first convex portion C52w is provided in a portion in the longitudinal direction may be adopted, or a configuration may be adopted where, as illustrated in FIG. 24B, a first convex portion C62w in which one of the end surfaces of the first flat-shaped portion 12f and one of the surfaces of the first convex portion C62w are not flush with each other is provided.

<Seventh Example of Modification>

The above-mentioned second embodiment is configured so that the first convex portion 22w of the first current path 22 and the second convex portion 62w of the second current path 62 have the same size and face each other at the same position. However, without limitation to this, a configuration in which, as illustrated in, for example, FIG. 25A, the first convex portion 22w of the first current path 22 and the second convex portion 62w of the second current path 62 are displaced from each other and face each other may be adopted.

<Eighth Example of Modification>

In the above-mentioned second embodiment, a configuration is adopted in which the first convex portion 22w of the first current path 22 and the second convex portion 62w of the second current path 62 extend to the respective end portions in the longitudinal directions of the first current path 22 and the second current path 62. However, without limitation to this, a configuration may be adopted in which, as illustrated in, for example, FIG. 25B, the first convex portion 22w and the second convex portion 62w are provided only in portions of the first current path 22 and the second current path 62, in which the connection portion 92 does not exist, and do not extended to end portions (C72a, C72b) in the longitudinal directions.

<Ninth Example of Modification>

While, in the above-mentioned second embodiment, a configuration in which the end portions in the longitudinal direction of each of the first current path 22 and the second current path 62 are opened is adopted, a configuration may be adopted in which, as illustrated in, for example, FIG. 25C, a wall portion 82w provided to stand from respective end portions (C72a, C72b) in the longitudinal directions of the first current path 22 and the second current path 62 and an end portion C92t of the connection portion 92 is provided.

<Tenth Example of Modification>

While, in the above-mentioned embodiments, the GMR elements are suitably used as the first magnetoelectric conversion elements (13, 23, 33) and the second magnetoelectric conversion elements (63, 73), the first magnetoelectric conversion elements (13, 23, 33) and the second magnetoelectric conversion elements (63, 73) only have to be magnetic detecting elements capable of sensing magnetism, are not limited to the above-mentioned embodiments, and may be arbitrarily changed without departing from the scope of the purpose of the present invention.

What is claimed is:

1. A current sensor for measuring a current of a device having a frequency between a minimum frequency and a maximum frequency, the current sensor comprising:

a first current path having a first end to be connected to the device such that the current to be measured flows through the first current path, the first current path including:
   a first flat-shaped portion having a first side and a second side extending in a direction in which the current to be measured flows therethrough; and
   a first protrusion provided on the first side of the first flat-shaped portion and extending along the first side such that the first current path has an L-shaped cross-section; and
   a first magnetoelectric conversion element provided on the first current path and configured to detect a first magnetism generated by the current to be measured flowing through the first current path, the first magnetoelectric conversion element being disposed at a first position on the first flat-shaped portion having the first protrusion,
wherein a minimum frequency magnetic flux density of the first magnetism generated by the current to be measured having the minimum frequency and a maximum frequency magnetic flux density of the first magnetism generated by the current to be measured having the maximum frequency are substantially the same at the first position.

2. The current sensor according to claim 1, wherein the first flat-shaped portion and the first protrusion are integrally formed by bending a metal plate.

3. The current sensor according to claim 1, further comprising:
   a second current path disposed in parallel to the first current path, the second current path having a first end to be connected to the device such that the current to be measured flows through the second current path, a second end of the second current path being connected to a second end of the first current path via a connection portion, the second current path including:
      a second flat-shaped portion having a first side and a second side extending in a direction in which the current to be measured flows therethrough, the first side of the second flat-shaped portion being farther away from the first current path than the second side of the second flat-shaped portion while the first side of the first flat-shaped portion being farther away from the second current path than the second side of the first flat-shaped portion; and
      a second protrusion provided along the first side of the second flat-shaped portion such that the second current path has an L-shaped cross-section; and
   a second magnetoelectric conversion element provided on the second current path and configured to detect the second magnetism generated by the current to be measured flowing through the second current path, the second magnetoelectric conversion element being disposed at a second potion on the second flat-shaped portion having the second protrusion,
wherein a minimum frequency magnetic flux density of the second magnetism generated by the current to be measured having the minimum frequency and a maximum frequency magnetic flux density of the second magnetism generated by the current to be measured having the maximum frequency are substantially the same at the second position,
and wherein the first magnetoelectric conversion element and the second magnetoelectric conversion element are provided on a same substrate.

4. The current sensor according to claim 3, wherein the first and second sides of the first and second flat-shaped portions extend beyond the first and second protrusions so as to form extended first and second flat-shaped portions without the first and second protrusions, respectively, the current sensor further comprising:
   another first magnetoelectric conversion element disposed at a third position on the extended first flat-shaped portion; and
   another second magnetoelectric conversion element disposed at a fourth position on the extended second flat-shaped portion.

5. The current sensor according to claim 3, wherein the first flat-shaped portion, the first protrusion, the connection portion, the second flat-shaped portion, and the second protrusion are integrally formed by bending a metal plate.

* * * * *